(12) United States Patent
Yamanashi et al.

(10) Patent No.: US 8,816,277 B2
(45) Date of Patent: Aug. 26, 2014

(54) PATTERN EVALUATION METHOD, DEVICE THEREFOR, AND ELECTRON BEAM DEVICE

(75) Inventors: Hiromasa Yamanashi, Tokyo (JP); Toru Yamanashi, legal representative, Kakamigahara (JP); Yasunari Sohda, Kawasaki (JP); Takeyoshi Ohashi, Tokyo (JP); Muneyuki Fukuda, Kokubunji (JP)

(73) Assignee: Hitachi High-Technologies Corporation, Tokyo (JP)

( * ) Notice: Subject to any disclaimer, the term of this patent is extended or adjusted under 35 U.S.C. 154(b) by 107 days.

(21) Appl. No.: 13/386,540

(22) PCT Filed: Jul. 26, 2010

(86) PCT No.: PCT/JP2010/004743
§ 371 (c)(1),
(2), (4) Date: Aug. 13, 2012

(87) PCT Pub. No.: WO2011/013342
PCT Pub. Date: Feb. 3, 2011

(65) Prior Publication Data
US 2013/0026361 A1    Jan. 31, 2013

(30) Foreign Application Priority Data

Jul. 27, 2009 (JP) ................................. 2009-174315
Aug. 10, 2009 (JP) ................................. 2009-185845

(51) Int. Cl.
*G01N 23/04* (2006.01)
*G01N 23/00* (2006.01)

(52) U.S. Cl.
USPC ........................... 250/307; 250/306; 250/309

(58) Field of Classification Search
USPC .............. 250/306, 307, 309, 310, 311, 492.1, 250/492.2, 492.22, 492.3
See application file for complete search history.

(56) References Cited

U.S. PATENT DOCUMENTS

| | | |
|---|---|---|
| 2003/0010914 A1 | 1/2003 | Takane et al. |
| 2004/0119022 A1 | 6/2004 | Sato et al. |
| 2005/0285034 A1 | 12/2005 | Tanaka et al. |
| 2006/0060781 A1 | 3/2006 | Watanabe et al. |
| 2011/0147586 A1 | 6/2011 | Fukuda et al. |

FOREIGN PATENT DOCUMENTS

| | | |
|---|---|---|
| JP | 05-041195 A | 2/1993 |
| JP | 2001-273861 A | 10/2001 |
| JP | 2002-134059 A | 10/2002 |
| JP | 2003-16983 A | 1/2003 |
| JP | 2003-016983 A | 3/2003 |
| JP | 2003-090719 A | 3/2003 |
| JP | 2004-127930 A | 4/2004 |
| JP | 2005-310602 A | 11/2005 |
| JP | 2006-010375 A | 1/2006 |
| JP | 2006-332069 A | 7/2006 |
| JP | 2007-208039 A | 8/2007 |
| JP | 2008-084626 A | 4/2008 |
| JP | 2008-198405 A | 8/2008 |

*Primary Examiner* — Nicole Ippolito
*Assistant Examiner* — Hanway Chang
(74) *Attorney, Agent, or Firm* — Mattingly & Malur, PC

(57) ABSTRACT

An amount of pattern position displacement between observation images acquired by irradiating from two different directions is changed depending on beam deflection for moving an image acquisition position. In a pattern evaluation method that measures astigmatic difference or focus position displacement having a small amount of dose at a high speed using parallax caused by the tilted beam, a correction value obtained in advance by measurement is reflected in an amount of pattern position displacement between observation images obtained by irradiating from at least two different directions and generated in accordance with the amount of beam deflection for moving an image acquisition position. A processing unit calculates an amount of correction of an amount of pattern position displacement depending on beam deflection of a beam deflecting unit for moving an image acquisition position on the sample at a high speed.

22 Claims, 29 Drawing Sheets

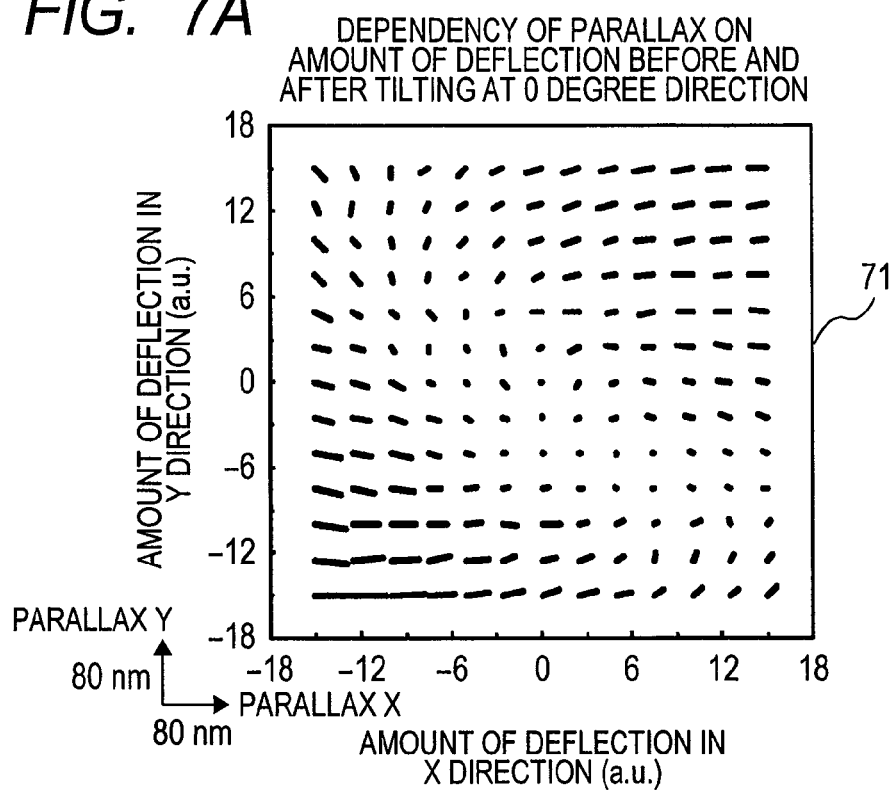
FIG. 7A  DEPENDENCY OF PARALLAX ON AMOUNT OF DEFLECTION BEFORE AND AFTER TILTING AT 0 DEGREE DIRECTION
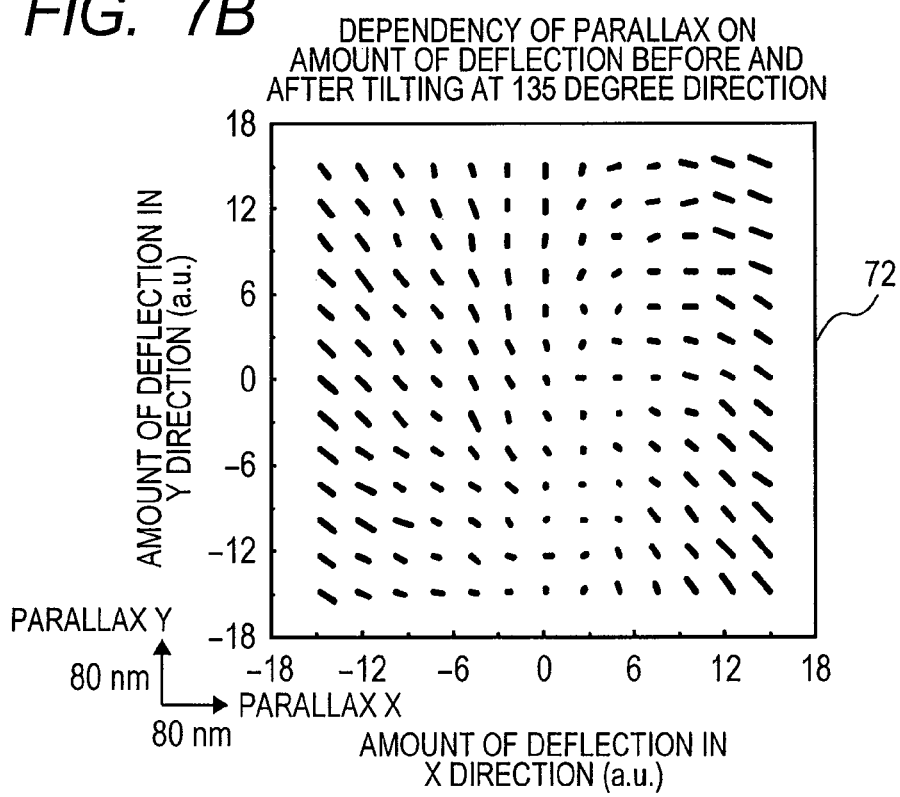
FIG. 7B  DEPENDENCY OF PARALLAX ON AMOUNT OF DEFLECTION BEFORE AND AFTER TILTING AT 135 DEGREE DIRECTION

FIG. 8

| ACCELERATING VOLTAGE (V) | OPTICAL MODE | TILTING DIRECTION (DEGREE) | a1 | a2 | b1 | .... |
|---|---|---|---|---|---|---|
| 800 | HIGH RESOLUTION | 0 | −1.35 | 0.47 | −1.55 | .... |
| 800 | HIGH RESOLUTION | 90 | −0.79 | 0.37 | −1.16 | .... |
| ⋮ | ⋮ | ⋮ | ⋮ | ⋮ | ⋮ | |

FIG. 9A

| ACCELERATING VOLTAGE (V) | OPTICAL MODE | ADJUSTMENT STATUS | REMARKS |
|---|---|---|---|
| 800 | HIGH RESOLUTION | ○ | --- |
| 800 | DEPTH OF FOCUS | × | --- |
| 500 | HIGH RESOLUTION | ○ | --- |
| 500 | DEPTH OF FOCUS | ○ | ONLY FOCUS CORRECTION IS AVAILABLE |
| ⋮ | ⋮ | ⋮ | ⋮ |

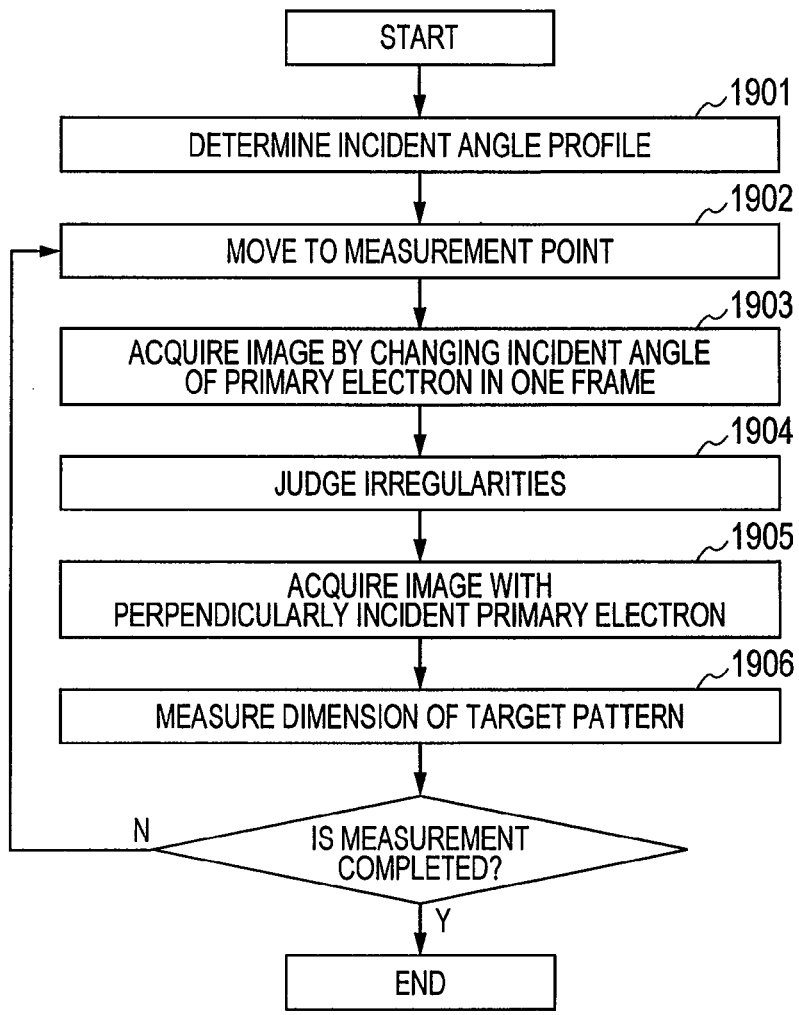
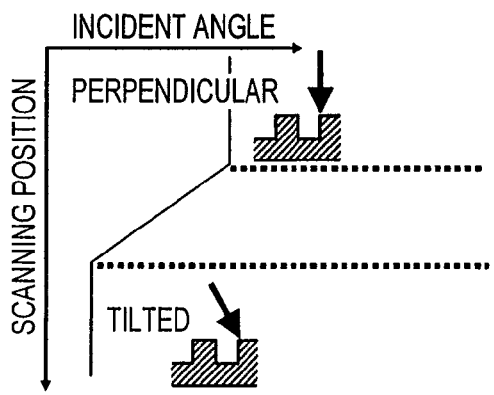

PATTERN EVALUATION METHOD, DEVICE THEREFOR, AND ELECTRON BEAM DEVICE

TECHNICAL FIELD

The present invention relates to a pattern evaluation technology using a charged particle beam that can acquire a two dimensional scanning image indicating a shape or a dimension of a minute pattern formed on a surface of a sample by scanning a charged particle beam onto a surface of the sample (for example, a semiconductor wafer or a reticle) and detecting a secondary charged particle or a reflection particle generated from the sample charged particle microscope, and easily judge irregularities on the surface of the sample.

BACKGROUND ART

Currently, a critical dimension scanning electron microscope (hereinafter, abbreviated as CDSEM) is mainly used to measure a dimension of a semiconductor device pattern. The structure of the CDSEM is basically the same as a scanning electron microscope. First of all, an electron discharged from a thermal or field emission electron source is accelerated. Thereafter, an electron beam obtained by reducing a diameter of the electron beam using a lens is formed. By two dimensionally scanning the electron beam on the sample (for example, a semiconductor wafer or a reticle) and detecting a generated secondary electron or a reflection electron, it is possible to acquire a minute pattern scanning image formed on the sample.

Some new materials that are recently introduced to a process have weak resistance against the electron beam. Therefore, it is required to reduce the damage caused by lowering energy of an incident electron. However, as the energy of the electron beam becomes lower, the resolution becomes deteriorated. Therefore, the lowering of energy contradicts a trend of the high resolution of the CDSEM required for the minuteness of a circuit pattern. Therefore, an accelerating voltage after electrons are generated from the electron source is set to be high, and then a mechanism that applies a decelerating electric field (that is, applies retarding voltage) before the electrons enter onto the sample is provided. Therefore, it is possible to achieve both increasing of resolution and lowering of damage of an image to be acquired.

In the meantime, some samples to be measured may have a surface formed of an insulating material. A trajectory of an electron beam after reducing the speed is bent due to the charging or distribution of the surface of the sample. Accordingly, it is proved that the focus position displacement or astigmatism of the CDSEM occurs. There are two reasons of charging of the sample: one is that the sample is originally charged, and the other is that the sample is charged by irradiating the electron beam by the CDSEM. As a reason that the sample to be carried in is charged, the polarization of organic materials that forms a resist, caused by the friction at the time of resist applying process and the fixation thereof are estimated. However, all reasons of charging cannot be explained. It is considered that the charging is caused by fixed charges that remain even when the sample is grounded.

Examples of charging caused by irradiating an electron beam include charging occurring by an incident primary electron at the time of observing sample observation or acquiring an image for measuring an automatic recipe. If the above-mentioned charging occurs, a conversing position of the incident electron beam is displaced from the surface of the sample by the change in the trajectory of the charged particle incident onto the sample, such that focus position displacement or astigmatism occurs. Therefore, it is required to adjust the focus position displacement or to correct the astigmatic difference, which results in lowering the throughput. Further, if the charging has in-plane distribution and the charging amount is varied between the chips on the sample, whenever the measuring chip is changed, the focusing adjustment or astigmatism correction described above is required, which results in lowering the throughput.

In this regard, Patent Literature 1 discloses a technology of measuring the astigmatic difference from the distance between the focuses in which a contrast of a differential image becomes maximum in perpendicular directions in different focal positions by image processing. Further, Patent Literature 2 discloses a technology that one part of an on-axis beam is blocked by an aperture and the astigmatism is corrected so that the amount of movement of the beam on the sample becomes minimum when the focal position is deviated, in consideration of a parallax method.

The above-mentioned scanning electron microscope accelerates a primary electron discharged from an electron source and converses the primary electron using an electrostatic or electromagnetic lens to irradiate the primary electron onto a surface of a sample. A secondary electron is generated from the sample by irradiating the primary electron. If the irradiated electron beam is scanned on the surface of the sample to acquire an intensity of the secondary electron signal, the amount of secondary electrons generated from edge parts of various patterns formed on the surface of the sample is increased. Therefore, an electron microscope image (SEM image) onto which the shape of the sample is reflected is acquired. A bright portion corresponding to the edge part having the shape of the sample represented in the image is referred to as a white band. Further, scanning electron microscopes are disclosed, for example, in Patent Literatures 3 to 6.

CITATION LIST

Patent Literature

Patent Literature 1: JP-A No. 2003-16983
Patent Literature 2: JP-A No. 2002-134059
Patent Literature 3: JP-A No. H05-41195
Patent Literature 4: JP-A No. 2006-332069
Patent Literature 5: JP-A No. 2006-010375
Patent Literature 6: JP-B No. 2004-127930

SUMMARY OF INVENTION

Technical Problem

According to Patent Literature 1, in order to measure the astigmatic difference, it is required to acquire and compare several tens sheets of images. Therefore, in the scanning electron microscope that is observed before and after 10 pA, it takes several tens of seconds to correct the astigmatism. In the meantime, in Patent Literature 2, there is a limit in the amount of movement of the beam on the sample when the focal position is deviated, and a higher speed of correction is expected as compared to the correction method disclosed in Patent Literature 1. However, the accuracy is insufficient.

According to the reviews by the inventors, it is proved that a method of registering and storing an electron optical system setting condition that irradiates a tilted beam that is obtained by tilting the charged particle beam from a normal line on the sample, comparing an observation image acquired by the tilted beam with an observation image acquired by a beam before being tilted to measure the amount of movement and the moving direction, and calculating the focus position displacement and an amount of astigmatic difference from an amount of movement and a direction of the image is efficient (Japanese Patent Application No. 2008-247001 filed on Sep. 26, 2008).

According to the disclosure of the above patent application, the beam can be tilted by appropriately setting plural deflectors of the charged particle optical system. Plural setting values are registered as a tilted trajectory in a storage area of a memory unit provided in a charged particle beam optical system controller for every tilted direction angle. With respect to an incident beam which is a reference, it is preferable the tilted direction for measuring the focus position displacement be one and tilted direction for measuring the astigmatic difference be four. The astigmatic difference and the focus position displacement can be measured using two to five sheets of images. Therefore, as compared to Patent Literature 2, this technology can increase the amount of movement of the beam on the sample when the focal position is deviated. Further, it is expected that accuracy and speed are compatible in this technology.

In the meantime, a normal CDSEM includes an electrical beam deflecting unit (for example, beam deflecting unit such as an electromagnetic deflector or an electrostatic deflector) in order to move an image acquisition position onto a desired pattern, which is an essential function for error correction of the amount of movement of the stage and focus correction outside the image acquisition position. However, it was proved through our reviews that the amount of pattern position displacement between the images obtained before and after tilting (that is, parallax) varies depending on the amount of deflection of the electrical beam. In other words, a technology that corrects astigmatism or a focus having a small amount of dose at a high speed, which is disclosed in Japanese Patent Application No. 2008-247001, has the error caused by the beam deflecting unit that moves the image acquisition position.

Similarly, it was also proved through our reviews that if the height of the sample is varied, the amount of pattern position displacement depending on the amount of beam deflection is correspondingly varied. Further, it is confirmed that the amount of pattern position displacement depends on a tilting direction of the beam, a tilting angle, an accelerating voltage of a beam, and an optical system mode (selects a resolution priority mode or a focus depth priority mode in a mode where beam opening angles are different).

In the above-mentioned scanning electron microscope, generally, the primary electron is incident substantially perpendicularly to the surface of the sample. However, even though the edge position of the sample may be known from one sheet of SEM image acquired with the perpendicularly incident primary electron, it is difficult to judge whether the shape is concave or convex (hereinafter, referred to as judgment of irregularities).

For example, in case of a pattern in which concave portions and convex portions are regularly arranged such as a line and space pattern in which wiring lines are arranged at a regular interval in a semiconductor circuit, it is difficult to judge the irregularities from the SEM image acquired with perpendicularly incident primary electron.

Actually, the incidence of the primary electron may deviated by ±0.1° from 90 degree, but if the range is within a range where the white-band width is not varied, similarly to the above description, it is difficult to judge the irregularities.

FIGS. 15A and 15B show a principle to judge the irregularities of the line and space pattern using two sheets of images having different incident angles 1504 of the primary electron. FIG. 15A shows that the primary electron 151 is incident perpendicularly onto the sample and FIG. 15B shows that the primary electron 151 is incident onto the sample with a tilted incident angle 1504.

In upper parts of the drawings, a cross-section 1502 of the sample having a line and space pattern formed on the surface thereof and a status that the primary electron 1501 is incident onto the sample are shown. In lower parts of the drawings, acquired SEM images 1503 are shown. In the SEM images, a white part 1505 indicates the white band and corresponds to an edge of a surface shape of the sample.

When paying attention to the rightmost white band 1505 of the two sheets of SEM images, it is understood that if the incident angle 1504 of the primary electron is changed from the right angle to a tilted angle, the white-band width becomes larger. The change is caused because the primary electron reaches the side of the edge corresponding to the white band 1505 by tilting the incident angle of the primary electron.

Therefore, when the white-band width becomes larger, it is possible to judge that the side where the incident angle is tilted becomes a concave part as seen from the edge corresponding to the white band.

Patent Literature 3 discloses a method of measuring a three-dimensional shape of a sample from a stereoscopic view by acquiring two sheets of images having different incident angles of a primary electron. Further, Patent Literature 4 discloses a method of judging irregularities from a change in a white-band width of plural images having different incident angles of primary electron. However, if the incident angle of the primary electron is changed, the irradiation position of the primary electron moves in some cases. If the position displacement occurs, it may be a problem in judging the irregularities of periodic pattern.

FIG. 16 compares an SEM image 1601 acquired with the perpendicularly incident primary electron with an SEM image 1602 acquired with a tilted primary electron with respect to a periodic pattern such as a line and space pattern when the position displacement occurs. As shown in FIG. 16, if the position displacement occurs ¼ or more of an interval 1603 of the pattern, it is not possible to correctly identify the white band corresponding to the same edge in the two sheets of images having different incident angles, and thus it is not possible to judge irregularities with respect to the SEM image 1601.

Further, the above-mentioned position displacement does not matter in case of a non-periodic pattern such as an independent pattern because it is possible to identify the white band on the image from the characteristics of the pattern shape. Further, if it is possible to judge that irregularities correspond to which part of design data from the characteristics of the shape, it is not necessary to judge the irregularities using the SEM image.

Patent Literature 5 discloses a method of identifying the pattern and judging the irregularities by comparing images with small position displacement which are obtained by gradually changing the incident angle of the primary electron little by little. Further, it is possible to logically cope with the problems of position displacement accompanied by the change in the incident angle of the primary electron. However, in the method of matching the image acquired by gradually changing the incident angle of the primary electron, which is disclosed in Patent Literature 5, plural images are required, and thus it takes time to judge the irregularities.

Specifically, when the irregularities of the minute pattern are judged, an interval of a step that changes the incident angle of the primary electron is reduced, the position displacement occurring by a change in the incident angle of the primary electron in one step should be sufficiently shorter than ¼ of the pattern interval, and the number of acquired images is increased, which results in a serious problem in measuring time. With the recent miniaturization of the semiconductor circuit, it is required to observe the minute pattern.

For example, it is also required to observe a circuit whose pattern interval is 50 nm or less. If the above condition is considered, the amount of position displacement should be limited to about 10 nm or less. In the meantime, the incident angle of the primary electron is changed by 2°, the position displacement of 500 nm or more may occur.

In order to make the amount of position displacement occurring by changing the incident angle of the primary electron in one step be 10 nm or less, the change of incident angle of 2° should be divided into 50 steps or more. Therefore, 50 sheets or more of images should be acquired. If it is assumed that it takes 30 ms to acquire one sheet of image, it takes 1.5 second to judge one point of irregularity. In the electron microscope used in a semiconductor inspection device, inspection for one point is performed in several seconds, and if the irregularity judgment is performed using the above method, the throughput is seriously deteriorated.

Meanwhile, Patent Literature 6 discloses a method of obtaining in advance the relationship between the incident angle of the primary electron and the amount of position displacement and then performing correction. This correction method of position displacement predicts the amount of position displacement only from the incident angle of the primary electron to calculate the amount of correction. However, the amount of position displacement depends on not only the incident angle of the primary electron, but also the accelerating voltage of the primary electron, excitation of an objective lens, and an amount of deflection of an image shift deflector.

For example, the amount of position displacement is changed as follows when the amount of change in incident angle is 2°: about 100 nm due to the difference in the change in the accelerating voltage of the primary electron (from 300 V to 800 V), about 50 nm due to the change in the excitation of the objective lens (from 2.9 mm to 3.0 mm of a focal distance), and about 100 nm due to the change in the amount of deflection of the image shift deflector (from 0 μm to 15 μm).

That is, if the amount of position displacement is estimated only from the incident angle to be corrected, 100 nm or more of position displacement remains under the condition of the electron optical system. Specifically, the image shift deflector is used to correct the random variation in the amount of the movement of the stage to determine the image acquisition area on the sample. Therefore, it is difficult to estimate because of a random amount of the deflection. Accordingly, according to the correction method, it is not possible to cope with the change in the condition of the electron optical system.

A first object of the present invention is to provide a pattern evaluation method and a device therefor that do not deteriorate the measurement accuracy in an astigmatism or focus correction technology with a small dose amount at a high speed using a tilted charged particle beam.

A second object of the present invention is to provide an electron beam device that is capable of judging irregularities of the periodic pattern formed on a substrate in a short time. Further, the second object of the present invention is to provide an electron beam device that is capable of judging irregularities under a predetermined optical condition.

Solution to Problem

In order to address the above first problem, as a minute pattern evaluation method using a charged particle beam of a charged particle beam device including a charged particle optical system and a processing unit, the present invention provides a method in which the charged particle beam is irradiated on the sample based on an optical system condition for irradiating a charged particle beam onto a sample from at least two different directions, the images acquired by irradiating the charged particle beam on the sample from the at least two different directions are compared to measure an amount of pattern position displacement between the images, and the processing unit corrects the amount of pattern position displacement based on the amount of correction of the amount of the pattern position displacement depending on the beam deflection of the charged particle beam for moving an image acquisition position on the sample. Further, a pattern evaluation method in which the processing unit calculates an amount of astigmatic difference or an amount of focus position displacement from the amount of pattern position displacement corrected with the amount of correction, or both of them is provided.

Further, in order to address the above problems, as a pattern evaluation device using a charged particle beam, the present invention provides a configuration including: a charged particle optical system that irradiates a charged particle beam on a sample; a memory unit that registers and stores an optical system condition of the charged particle optical system for irradiating the charged particle beam from at least two different directions; a processing unit that calculates an amount of pattern position displacement between images by comparing images obtained by irradiating the charged particle beam from the at least two directions based on the optical system condition; and a beam deflector that deflects the charged particle beam, in which the processing unit calculates an amount of correction of the amount of the pattern position displacement based on the beam deflection of the beam deflector for moving an image acquisition position on the sample and corrects the amount of the pattern position displacement using the amount of correction. Further, the processing unit calculates an amount of astigmatic difference of the charged particle beam or an amount of focus position displacement from the amount of pattern position displacement corrected with the amount of correction, or both of them.

That is, in order to address the above first problem, the present invention includes a processing unit that calculates an amount of correction of the amount of the pattern position displacement between images depending on the beam deflection of the beam deflector for moving an image acquisition position on the sample and corrects the amount of the pattern position displacement using the amount of correction to correct the above error. Further, since the processing unit calculates in accordance with parameters such as an accelerating voltage of the charged particle beam or a height of the sample, a tilting direction and a tilting angle of the charged particle beam to be irradiated, it is possible to prevent the error in various usage conditions. Further, a controller that feed backs the amount of the correction to the beam deflector is provided, which allows the above problems to be addressed.

As an example that addresses the above second problem, the present invention provides an electron beam device, including: an electron source; a stage that loads a sample; a detector that detects an electrical signal from the sample; a control operating unit that controls the electron source, the stage, and the detector and creates image data by the electrical signal detected by the detector. The control operating unit includes: an incident angle/scanning cooperative controller that controls the scanning and the incident angle to the sample of the electron beam discharged from the electron source; and an irregularity judgment operating unit that judges irregularities on a surface of the sample using the image data created based on the electrical signal from the sample generated by the scanned electron beam while changing the incident angle to the sample by the incident angle/scanning cooperative controller.

Further, the present invention provides an electron beam device, including: an electron source; a stage that loads a sample; a detector that detects an electrical signal from the sample; a deflecting unit that changes an incident angle of electron beam discharged from the electron source to the sample; an accelerating unit that accelerates the electron beam; an image shift deflector that changes an irradiation range of the electron beam; an objective lens that converges the electron beam; and a control operating unit that controls controllers that controls the above elements and creates image data by the electrical signal detected by the detector. The control operating unit includes: a position displacement estimation operating unit that estimates an amount of irradiating position displacement of the electron beam on the surface of the sample in accordance with an incident angle of the electron beam with respect to the sample that is changed by the deflecting unit, an accelerating voltage of the electron beam accelerated by the accelerating unit, an amount of deflection changed by the image shift deflector, and the excitation of the objective lens; a position displacement correction controller that corrects the amount of position displacement estimated by the position displacement estimation operating unit; and an irregularity judgment operating unit that judges irregularities of a specific pattern of the sample from a plurality sheets of image data having different incident angles of the electron beam whose position displacement is corrected by the position displacement correction controller.

The present invention provides an electron beam device, including: an electron source; a stage that loads a sample; a detector that detects an electrical signal from the sample; a deflecting unit that changes an incident angle of electron beam discharged from the electron source to the sample; an accelerating unit that accelerates the electron beam; an image shift deflector that changes an irradiation range of the electron beam; an objective lens that converges the electron beam; and a control operating unit that controls controllers that controls the above elements and creates image data by the electrical signal detected by the detector. The control operating unit includes: a position displacement estimation operating unit that estimates an amount of irradiating position displacement of the electron beam on the surface of the sample in accordance with an incident angle of the electron beam with respect to the sample that is changed by the deflecting unit, an accelerating voltage of the electron beam accelerated by the accelerating unit, an amount of deflection changed by the image shift deflector, and the excitation of the objective lens; and an irregularity judgment operating unit that judges irregularities of a specific pattern of the sample from a plurality sheets of image data whose incident angles of the electron beam are different in consideration of the amount of position displacement estimated by the position displacement estimation operating unit.

The present invention provides an electron beam device, including: an electron source; a stage that loads a sample; a detector that detects an electrical signal from the sample; a deflecting unit that changes an incident angle of electron beam discharged from the electron source to the sample; an accelerating unit that accelerates the electron beam; an image shift deflector that changes an irradiation range of the electron beam; an objective lens that converges the electron beam; and a control operating unit that controls controllers that controls the above elements and creates image data by the electrical signal detected by the detector. The control operating unit includes: a position displacement profile estimation operating unit that estimates an amount of irradiating position displacement of the electron beam on the surface of the sample in accordance with an incident angle of the electron beam with respect to the sample that is changed by the deflecting unit, an accelerating voltage of the electron beam accelerated by the accelerating unit, an amount of deflection changed by the image shift deflector, and the excitation of the objective lens; an incident angle/image shift/scanning cooperative controller that corrects the scanning of the electron beam discharged from the electron source, an incident angle to the sample, and the amount of the position displacement estimated by the position displacement profile estimation operating unit; and an irregularity judgment operating unit that judges irregularities on the surface of the sample using image data created based on the electrical signal from the sample generated by the scanned electron beam while changing the incident angle to the sample by the incident angle/image shift/scanning cooperative controller and correcting the position displacement.

The electron beam device may include a unit that acquires one or a plurality sheets of images by changing an incident angle of an electron beam with respect to a sample when one sheet of image is acquired and obtains the relationship between an incident angle of an electron beam to the sample and an amount of irradiating position displacement of the electron beam on a sample surface from the image.

Further, the present invention provides an electron beam device, including: a controller that acquires a plurality sheets of images by changing an incident angle of an electron beam and identifies a recorded shape of the sample by detecting, from another image, a shape of the pattern in which the electron beam is not irradiated on a side wall of the pattern when the incident electron beam is tilted among patterns formed on the sample surface from another image to judge irregularities of a specific pattern of the sample from the image.

The electron beam device may include a controller that judges irregularities of a specific pattern of a sample and adjusts a focus position displacement using an image acquired by changing an incident angle of an electron beam.

Advantageous Effects of Invention

According to the present invention with the above configuration, by improving the measurement accuracy of the amount of the focus position displacement or the amount of astigmatic difference by the parallax method, it is possible to improve the accuracy of the focus adjustment or the astigmatism correction. As a result, the speed of measuring the dimension of the pattern with good measurement reproducibility may be improved as compared with a method that uses a contrast in the related art.

Further, it is possible to provide an electron beam device that is capable of judging irregularities of the periodic pattern formed on a substrate in a short time. Further, it is possible to provide an electron beam device that is capable of judging irregularities under a predetermined optical condition including an accelerating voltage, excitation of the objective lens, and position displacement when the amount of deflection of primary electron beam is changed.

BRIEF DESCRIPTION OF DRAWINGS

FIG. 7A is a view showing an amount of pattern position displacement (parallax) between images before and after tilting beam at a 0 degree direction, which depends on the amount of deflection before tilting the beam, according to the first embodiment.

FIG. 7B is a view showing an amount of pattern position displacement (parallax) between images before and after tilting beam at a 135 degree direction, which depends on the amount of deflection before tilting the beam, according to the first embodiment.

FIG. 8 is a diagram showing an example of a table stored in a recording unit of a measuring device that uses a charged particle beam according to the first embodiment.

FIG. 9A is a view showing an example of a display of a usability condition of a screen display, according to the first embodiment.

FIG. 19 is a flowchart of automatic dimension measurement of a sample pattern according to the fourth embodiment.

FIG. 20A is an explanatory diagram according to fourth, fifth, and eighth embodiments, which shows a graph showing a relationship between a scanning position and an incident angle of a primary electron.

DESCRIPTION OF EMBODIMENTS

Hereinafter, the best modes of the present invention will be described in detail with reference to the drawings.

First Embodiment

In a first embodiment, in case of correcting an astigmatism and adjusting a focus from the image acquired in two or more different directions, the amount of correction of a pattern position displacement error depending on the amount of beam deflection and a tilting direction is reflected into a value of an acquired parallax to calculate the astigmatic difference and the amount of focus deviation, thereby correcting the astigmatism and adjusting the focus with high accuracy at a high speed.

Figure 1:
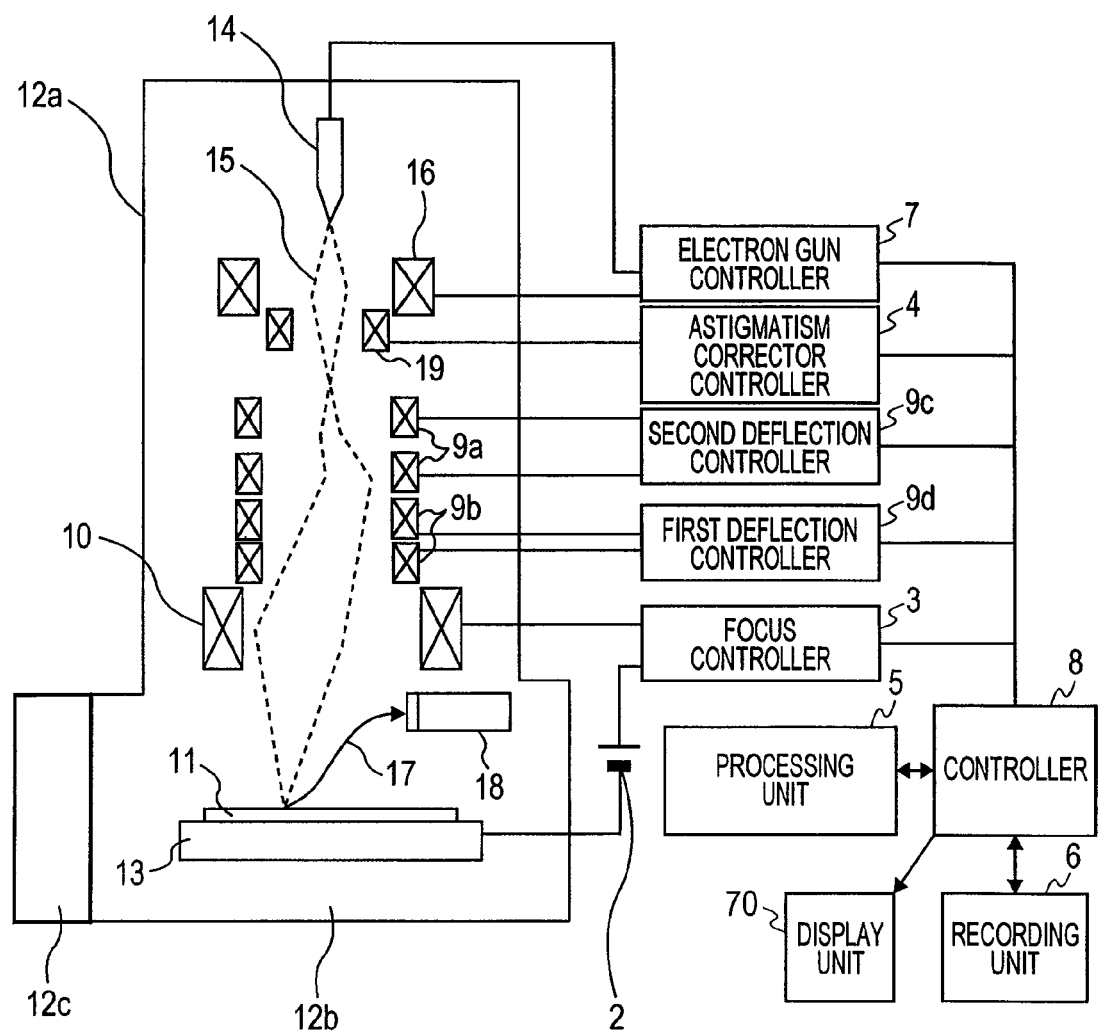
FIG. 1 is a schematic configuration diagram relating to a casing of a minute pattern evaluation device using a charged particle beam according to respective embodiments.

FIG. 1 is a schematic configuration diagram relating to a casing of a minute pattern evaluation device for measuring a pattern dimension that uses a charged particle beam according to a first embodiment. A wafer 11, which is a sample, is conveyed into a predetermined position in a vacuum sample chamber 12b directly below a casing 12a. In order to observe the wafer 11 that is provided on a wafer holder 13 that functions as a stage in the vacuum sample chamber 12b, a primary electron beam 15 discharged from an electron gun 14 passes through a convergence lens 16, an astigmatism corrector 19, a deflector 9a, a deflector 9b, and an objective lens 10 to be irradiated onto the wafer 11 on the wafer holder 13. A retarding voltage 2 having a predetermined value, which is output from a focus controller 3, is applied to the wafer holder 13 that holds the wafer 11, thereby adjusting energy of the electron beam that is incident to the sample wafer 11 to have a desired value. When the incident electron is irradiated to the minute pattern on the wafer, a secondary electron 17 generated from the sample wafer 11 enters a detector 18 to be detected as a signal. Further, even though the connecting destination of an output of the detector 18 is not shown, the detected signal, which is an output of the detector 18, is input to a processing unit 5, a controller 8, or the like by electric connection to be used for image creation and the like.

In other words, in this status, by two-dimensionally scanning the primary electron that is incident onto the sample by the first deflector 9b having a double stage structure, it is possible to acquire a two dimensional image from the detected signal. The scanning position in the first deflector may be electrically moved by the second deflector 9a having a double stage structure (a deflector for deflecting a beam to move an image acquisition position). In order to adjust the influence of difference in the height of the sample caused by the image acquisition position in the wafer, a focus controller 3 controls the objective lens 10 and the retarding voltage 2 in order to adjust a focus, and the astigmatism corrector controller 4 adjusts the astigmatism corrector 19 in order to correct the astigmatism. Accordingly, it is possible to obtain a secondary electron image required to accurately evaluate a minute pattern shape. The above-mentioned minute pattern evaluation device is used in a manufacturing line of a semiconductor device. Mostly, an automatic recipe that is programmed in advance is performed by a controller 8 for an entire device, so that an image having a designated pattern present in a measuring position on a wafer designated in the recipe can be automatically acquired.

Further, in the minute pattern evaluation device shown in FIG. 1, reference numeral 5 denotes a processing unit such as a central processing unit (CPU) that performs calculation of an amount of correction and the like, which is described below, reference numeral 6 denotes a recording unit such as a memory, reference numeral 7 denotes a light source optical system controller such as the electron gun 14, reference numerals 9c and 9d denote deflection controllers that control the deflectors 9a and 9b, and reference numeral 70 denotes a display unit that displays an image of the sample. If necessary, an output unit such as a printer and an input unit such as a key board, a mouse are connected to the controller 8. Further, in this specification, the controller 8 may include the processing unit 5, or the focus controller 3, the astigmatism corrector controller 4, the electron gun controller 7, and the first and second deflection controllers 9c and 9d. Further, it should be noted that the processing unit 5 and the recording unit 6 may be referred to as a controller. The processing unit 5, the recording unit 6, the controller 8, and the display unit 70 may be implemented by a normal computer such as a personal computer (PC) including a CPU, a memory, a display device, and the like, and the CPU executes programs such as various computation processing or control processing stored in the memory.

Figure 2A:
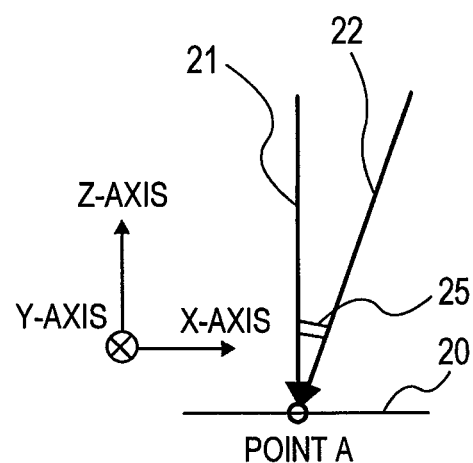
FIG. 2A is a diagram of a basic status which is in focus, showing a principle of an astigmatism or focus correction method using a tilted beam according to a first embodiment.

Next, when the beam is tilted, a method of correcting the astigmatism and focus using a parallax will be described with reference to FIGS. 2A, 2B, 2C, and 2D. when the irradiation position of the beam onto the surface 20 of the sample in FIG. 2A is represented using two perpendicular axes on the plane of the sample, that is, an X-axis and a Y-axis (X and Y are same as the movement shaft of the wafer stage), the focus or the astigmatism of a beam before being tilted is adjusted with respect to point A that is a reference position. Next, by overlapping different deflection amounts for each of the double stage deflectors of the second deflector 9a, a tilted beam 22 that is tilted with respect to the beam 21 in an X direction and irradiates point A that is the same position as the position before being tilted is formed. In this case, the amount of an angle at which the beam is tilted is denoted by reference numeral 25 and each of the amounts of deflection in the X direction and the Y direction is recorded in the recording unit 6 of the device. In this case, the beam irradiates point A that is the same position on the surface of the sample before and after being tilted.

Figure 2B:
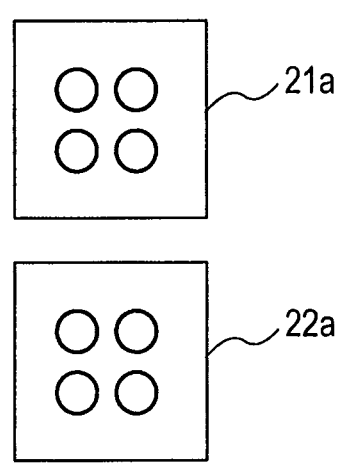
FIG. 2B is a diagram showing a parallax before and after tilting in FIG. 2A.

For example, the parallax is 0 when comparing an image 21a and an image 22a in FIG. 2B, which are the image 21a acquired by scanning a pattern having four holes with the beam 21 before being tilted, and the image 22a acquired by scanning a pattern having four holes with the beam 22 after being tilted (the positions of four hole patterns in the image are completely the same as each other).

Figure 2C:
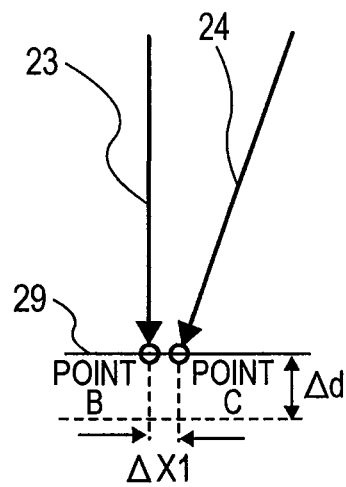
FIG. 2C is a diagram of a basic status in which a focus is deviated, showing a principle of an astigmatism or focus correction method using a tilted beam according to the first embodiment.
Figure 2D:
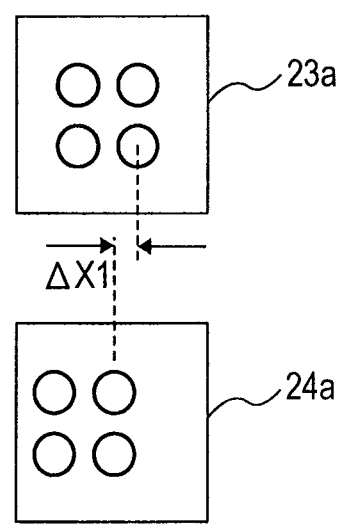
FIG. 2D is a diagram showing a parallax before and after tilting in FIG. 2C.

Next, from this status, it is assumed that as a result of moving the stage in order to observe near a point B, which is at a different position in the same wafer, the height of the sample is increased by Δd. As shown in FIG. 2C, the height of the sample is changed to be increased by Δd, and as a result, the focal position is moved downwardly by Δd as seen from the wafer. In this case, when the beam without being tilted matches the point B, the beam that is tilted under the same condition as FIG. 2A is irradiated in the position of the point C on the wafer. The images obtained by scanning using the non-tilted beam 23 and the tilted beam 24 are shown as images 23a and 24a in FIG. 2D, such that a parallax ΔX occurs between the patterns of the image 21b and the image 22b. When the parallax Δ between the two sheets of images obtained with the non-tilted beam and the tilted beam is measured, the amount Δd of focus position displacement may be calculated from the tilted angle of the beam and the parallax ΔX, which is a basic principle of detecting the focus position displacement by the parallax method.

For example, if the tilted angle which is a tilting angle of the beam is set to, for example, 30 mrad, the amount Δd of focus position displacement is calculated as follows.

$$\Delta d = \text{parallax} \times (1000/\text{tilted angle (mrad)}) \quad \text{[Equation 1]}$$
$$\approx \text{parallax} \times 33$$

This value is fed back to the focus controller 3 so as to adjust the focus. Since the focus position displacement is obtained when the in-focus plane is changed only in the Z-direction (direction perpendicular to X and Y), the focus may be adjusted by using observation images obtained with beams irradiated from at least two direction, that is, two observation images obtained in a perpendicular direction and one tilted direction. Further, if the focus position displacement obtained in plural tilted directions (for example, tilted in a direction parallel to the Y-axis) is averaged, it is possible to more accurately adjust the focus.

Figure 3:
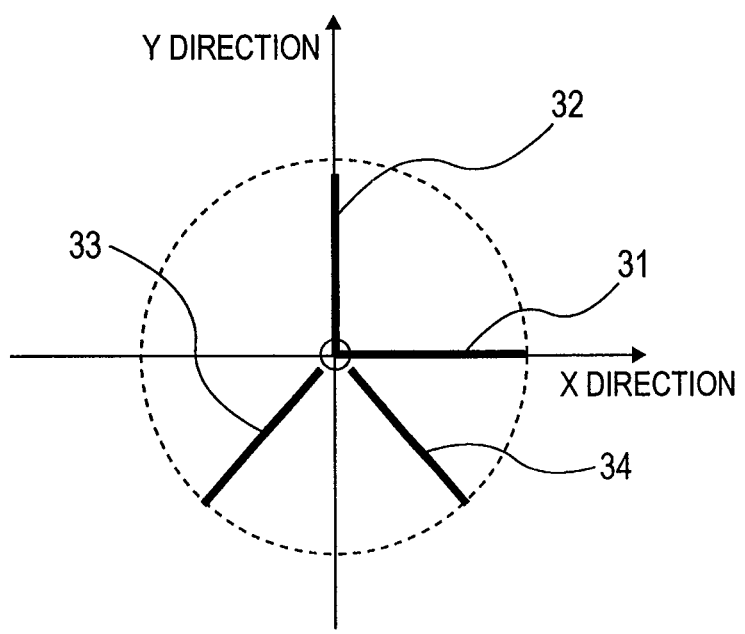
FIG. 3 is a projection view of a tilted beam onto an XY plane in four different directions according to the first embodiment.

Next, a method for correcting an astigmatism using a parallax when the beam is tilted will be described in brief. An amount of the focus position displacement when the astigmatism does not occur is constant regardless of an angle of a direction where the incident electron is tilted. However, if the astigmatism occurs, the amount of the focus position displacement is varied depending on an angle of a direction where the incident electron is tilted. In order to correct the astigmatism, by tilting the beam at plural angles of the direction, the amount of the focus position displacement needs to be measured in the respective directions. Here, the difference in the amount of the focus position displacement in two tilted directions is referred to as an astigmatic difference. For example, when the astigmatism is corrected using the parallax method, it is preferable to tilt the beam in at least four directions. When the Z-axis is seen from the above as shown in FIG. 3, if the X-direction is 0 degree and the tilting direction is shown at a counterclockwise angle, for example, in addition to the tilting of the beam in the X-axis direction (0 degree direction) described above, tilting at a 90 degree direction, a 225 degree direction, and a 315 degree direction corresponding to the tilting in a Y-axis direction may be used. Here, if the parallaxes in the respective tilting directions are D0, D90, D225, and D315, the value of the astigmatic difference in the 0 degree tilting direction and the 90 degree tilting direction is calculated as follows.

$$D0 \times 33 - D90 \times 33 \quad \text{[Equation 2]}$$

Further, the value of the astigmatic difference in the 225 degree tilting direction and the 315 degree tilting direction is calculated as follows.

$$D225 \times 33 - D315 \times 33 \quad \text{[Equation 3]}$$

A graph showing the correlation between the value of the astigmatic difference and the amount of correction of the astigmatism corrector that can be obtained by using an astigmatism correction method of the related art is acquired in advance, so that the astigmatism may be corrected from the value of the astigmatic difference obtained by the parallax method.

Figure 4:
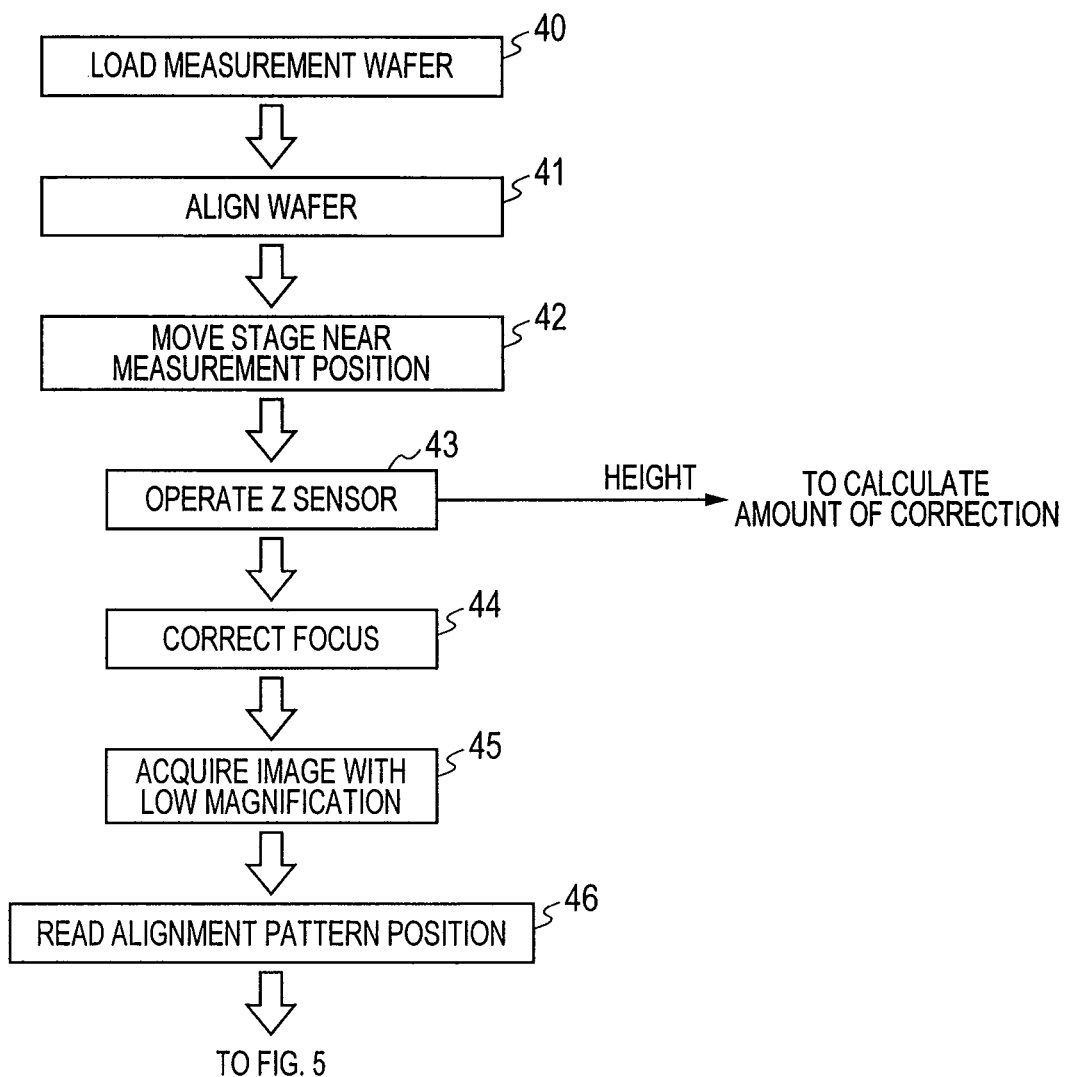
FIG. 4 is a flow chart (first part) of an automatic recipe according to the first embodiment.
Figure 5:
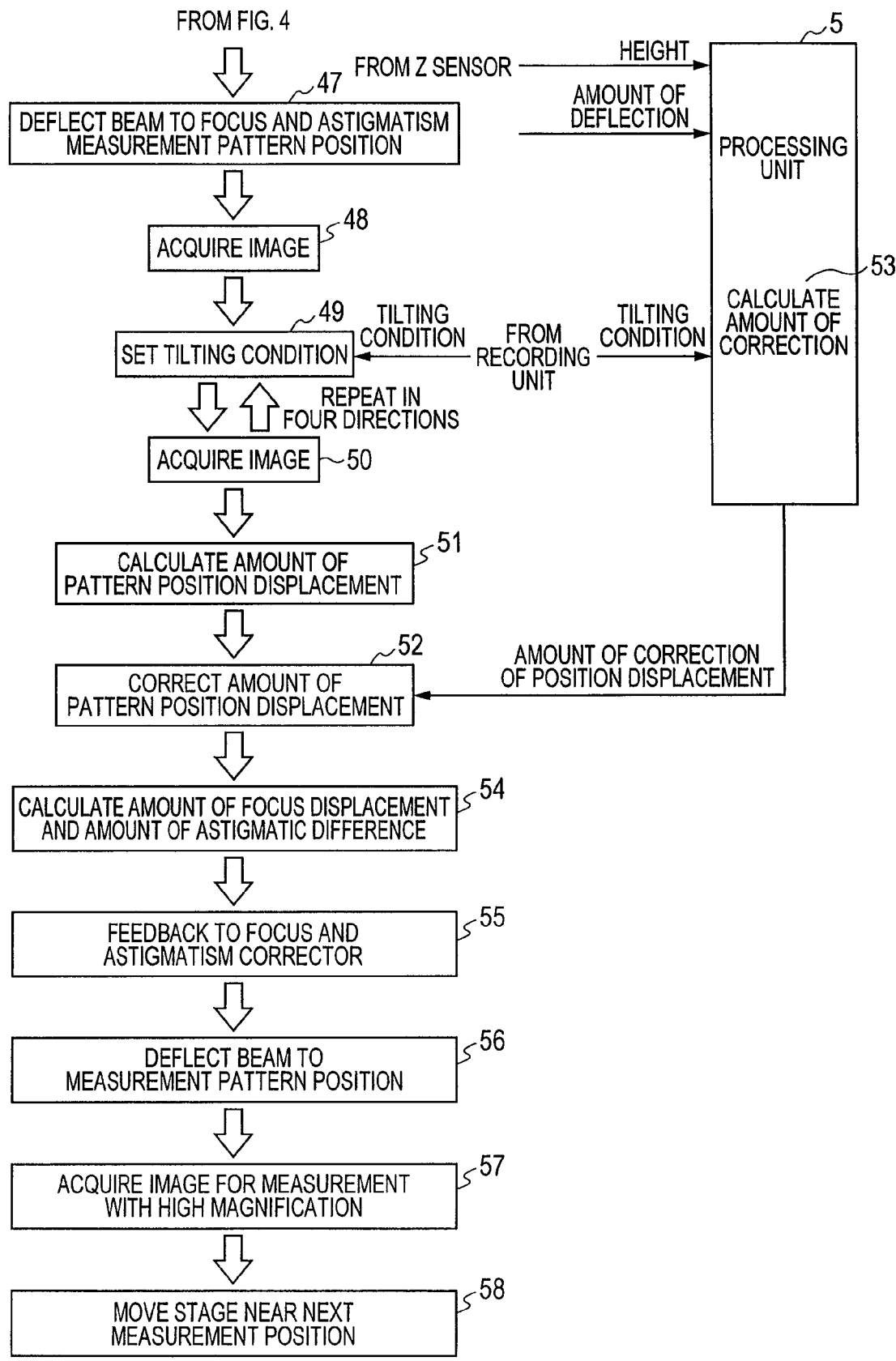
FIG. 5 is a flow chart (second part) of an automatic recipe according to the first embodiment.

From now, the first embodiment will be described with reference to the flowcharts shown in FIGS. 4 and 5. First, a wafer that is loaded and stored in a cassette is accommodated in an airtight container which is referred to as a front-opening unified pod (FOUP) in order to prevent dirt or contamination and then set in a minute pattern evaluation device shown in a schematic configuration diagram of FIG. 1. In this status, if the automatic recipe starts, a lid of the FOUP cassette is automatically open, and a measurement wafer is conveyed to a wafer holder 13, which moves from the cassette to a load lock chamber 12c shown in FIG. 1, by a conveyance arm. Next, the measurement wafer that is loaded in the wafer holder 13 is introduced on a stage of the vacuum sample chamber 12b (LOAD 40). In order to minutely adjust the position of the wafer with respect to the stage, the wafer alignment (41) is performed using a pattern on the wafer.

Further, if the stage is moved near a measurement position of the pattern that is registered in the recipe in advance (42), a Z sensor is automatically operated (43) to calculate a height of the sample and the value is transmitted to the processing unit 5. Simultaneously, in accordance with the operating distance which is a distance between a principle surface of a lens and a top edge of the sample or the height of the sample, the current of the objective lens is automatically set in order to adjust the focus of an image of the secondary electron (44).

Next, an image is acquired (45) in a comparatively low magnification and a position of an alignment pattern is read out from the image (46), so that the relative position of the beam and the wafer is detected. Based on the above information, the beam is deflected by the second deflector 9a (47) so that a pattern for measuring the focus position displacement or the astigmatic difference is positioned in a center of the screen. Here, two-dimensional information of the amount deflection is transmitted to the processing unit 5.

The importance of the second deflector 9a will be described here. First, since the sample stage mechanically moves, the accuracy of the actual arrival position with respect to a target amount of movement is limited, and it is required to use the sample stage together with an electrical beam moving unit in order to input the target pattern in a capturing visual filed in a high magnification. Further, if the measurement of the focus position displacement or the astigmatic difference is performed by a measuring pattern, damage occurs in the pattern before acquiring a measuring image, so that it is not possible to perform accurate measurement. Therefore, by the electrical beam moving unit, it is required to measure the focus position displacement or the astigmatic difference using another pattern proximate to a pattern to be measured. Therefore, it can be told that the beam deflection for moving the image acquisition position is necessary in the CDSEM.

An SEM image of a focus and astigmatism measurement pattern is acquired (48), and then the beam is tilted (49) in a determined direction (a tilting angle and direction) by the second deflector 9a in accordance with the tilting condition that is an optical system condition stored in the recording unit 6, so that the image is additionally acquired. According to the present embodiment, tilted images are acquired (50) under four conditions by changing directions at the same tilting angle. After calculating each of the amounts of pattern position displacement from the acquired images (51), the amount of pattern position displacement is corrected (52) in accordance with the amount of correction (the value of the correction of the position displacement) calculated by the processing unit 5. The amounts of the focus position displacement and astigmatic difference are calculated based on the above data (54).

By feeding back (55) to the focus controller 3 and the astigmatism corrector controller 4 based on the acquired amounts of the focus position displacement and astigmatic difference, it is possible to correct the focus position displacement and the astigmatic difference. After the correction, the beam is moved to a pattern position as a measurement target (56), and an image is acquired in a high magnification (57). Therefore, it is possible to perform the measurement (measure a pattern dimension) with high accuracy. After acquiring an image, the stage is moved near a next measurement position (58).

The above description is the entire flow of the first embodiment. Next, the correction of the amount of the pattern position displacement according to the present embodiment will be described in detail with reference to FIGS. 6A and 6B.

Figure 6A:
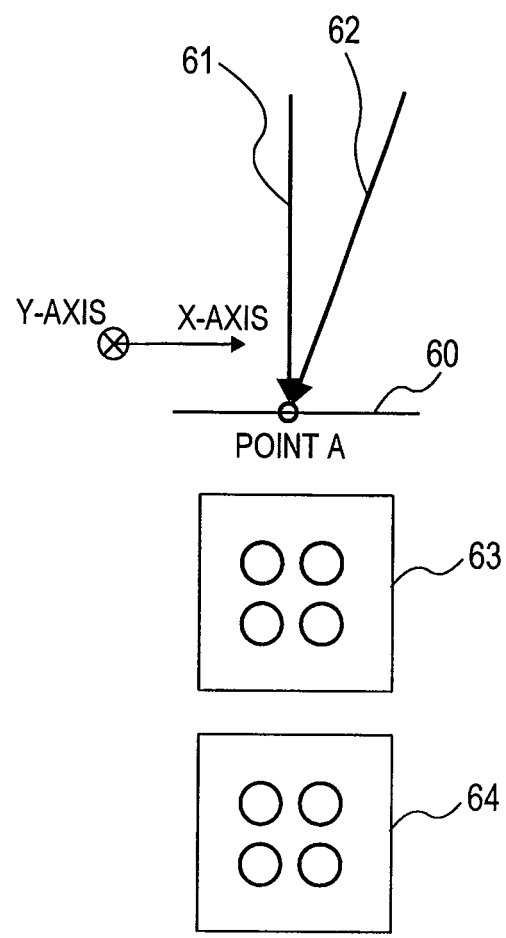
FIG. 6A is a diagram showing the difference in a sample irradiating positions before and after tilting the beam depending on the amount of deflection of the beam before tilting and the tilting direction according to the first embodiment.
Figure 6B:
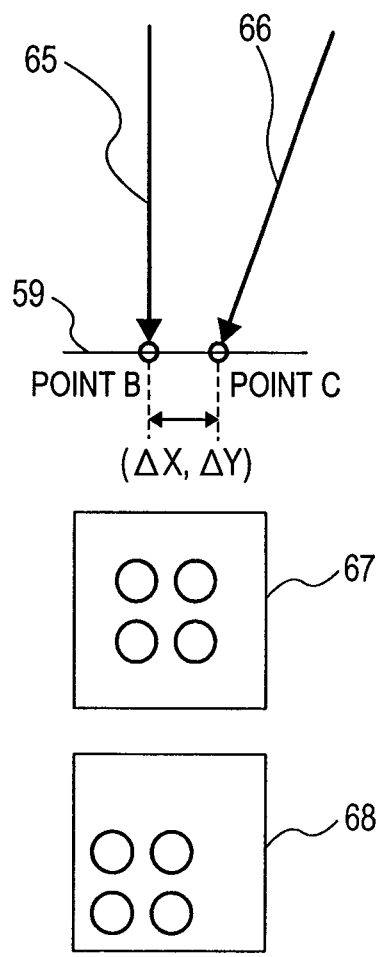
FIG. 6B is a diagram showing pattern position displacement between images before and after tilting beam caused by the amount of deflection before tilting the beam according to the first embodiment.

Referring to FIGS. 6A and 6B, a beam irradiation position of a beam on the surface 50 of the sample is represented by using two axes, that is, the X-axis and the Y-axis (X and Y are same as the moving shaft of the wafer stage) that are perpendicular to the plane of the sample. FIG. 6A shows that both a beam 61 before being tilted and a beam 62 after being tilted are irradiated onto point A that is a reference position in a status where the focus and the astigmatism match the surface of the wafer and the beam is not deflected. In a status where the focus position is not displaced or the astigmatic difference does not occur, even when comparing an image 63 or an image 64 obtained by irradiating beams before and after being tilted onto point A that is the same position on the surface 60 of the sample and scanning the beam 61 or 62 using the deflector, the positions of the patterns in the image are the same as each other.

In the image obtained by capturing the surface of the sample shown in FIG. 6A, four holes are formed around point A as the center. However, if the beam is moved to a position where the beam is deflected by the second deflector to be irradiated onto point B, as shown in FIG. 6B, a parallax of a distance (ΔX, ΔY) between irradiation point A of a beam 65 before being tilted and irradiation point C of a beam 66 after being tilted occurs. Therefore, when comparing an image 67 obtained by scanning the beam 65 and an image 68 obtained by scanning the beam 66, the positions of four hole patterns in the image are different from each other. It is proved through our experiments that the value of the amount (ΔX, ΔY) of pattern position displacement on the image depends on the amount of deflection. Further, if the amount of deflection is large, the value may become several tens nm. The example thereof will be described with reference to FIGS. 7A and 7B.

The graph 71 of FIG. 7A shows dependency of the amount (ΔX, ΔY) of pattern position displacement on the amount of beam deflection in case of being tilted at 800 V of an accelerating voltage in the 0 degree direction. In FIG. 7A, the amount (ΔX, ΔY) of pattern position displacement in which the amount (X, Y) of beam deflection is generated in a range of (±15, ±15) (the width of a measurement point is 2.5 pitch) is represented by the length and the direction of a thick line. For example, if the amount of the beam deflection is (15, −15), the amount of the pattern position displacement is approximately ΔX=20 nm, and ΔY=20 nm. The amount of the pattern position displacement depending on the amount of deflection on becomes an error when the focus position displacement and the astigmatic difference are measured using the parallax method. When the tilted angle is 30 mrad, the error of the amount of the position displacement of 20 nm is converted into an error of the focus deviation, the error is 670 nm, which is too big to ignore.

According to the present embodiment, the dependency of the error of the amount of the position displacement on the amount of the beam deflection is corrected to realize the accurate measurement of the focus position displacement and the astigmatic difference.

Now, the dependency of the amount of the position displacement on the amount of the beam deflection, which is an error, is approximated with a polynomial equation. Specifically, as the amount of the pattern position displacement (ΔX, ΔY) and the amount of deflection (X, Y), the following equations are used.

$$\Delta X = a1 * X^2 + b1 * X * Y + C1 * Y^2 + d1 * X + e1 * Y + f1 \quad \text{[Equation 4]}$$

$$\Delta Y = a2 * X^2 + b2 * X * Y + C2 * Y^2 + d2 * X + e2 * Y + f2 \quad \text{[Equation 5]}$$

Here, a1, a2, b1, b2, c1, c2, d1, d2, e1, e2, f1, and f2 are a constant number.

In addition to the polynomial equation, a spline function or a table look-up method may also be used. The amount of deflection (X, Y) may be varied for every measurement point, such that the amount (ΔX, ΔY) of the pattern position displacement should be calculated in a predetermined amount (X, Y) of the deflection. Therefore, even in the table look-up method, the interpolation processing is required for the amount (X, Y) of the deflection that does not exist in the table. Further, the present embodiment uses a second order polynomial equation because it is considered that the reason of the error is caused by an off-axis distortion in the objective lens and the off-axis distortion may be represented by the second order polynomial equation when considering to a third order term. Therefore, if each of the above constant numbers is stored in the recording unit 6 of the device, the correction may be calculated in the processing unit 5. Further, since the constant numbers depend on the height of the sample, in order to measure a sample having a different height, constant numbers for plural heights are calculated, and the sample having a height between the constant numbers is interpolated to calculate the constant numbers again, thereby copying with that. The parallax corrected as described above may be replaced with a parallax of the above-mentioned Equation 1.

The error depending on the amount of the deflection depends on a tilting direction of the beam, that is, a tilting angle and a tilting direction. A case of being tilted at 800 V of the same accelerating voltage in the 135 degree direction is shown in a graph 72 of FIG. 7B. Even though the dependency is represented using a polynomial equation of X and Y which is the same as that of FIG. 7A, FIG. 7B is apparently different from FIG. 7A. That is, the correction according to the present invention depends on both beam deflection for moving the image acquisition position and a beam tilting condition. Therefore, when plural tilted beams are used as in the astigmatic difference measurement, it is required to store corresponding constant numbers in the recording unit 6.

Further, it is confirmed that the constant numbers are varied depending on a mode of an optical system or the accelerating voltage. Therefore, a table 80 in which the conditions such as the accelerating voltage 81 to be used, an optical mode 82, a tilting direction 83, and the like and corresponding constant numbers a1, a2, b1, and the like, which are shown in FIG. 8 are set is stored in the recording unit 6. If the trajectory of the beam is changed by switching the electron source or the aperture, the constant number may be changed and at the time of regular maintenance, constant numbers needs to be updated. However, if the constant numbers are updated for all available conditions, it is impractical when the measurement time is considered, and the conditions to be used are selected to update the constant numbers.

Figure 9B:
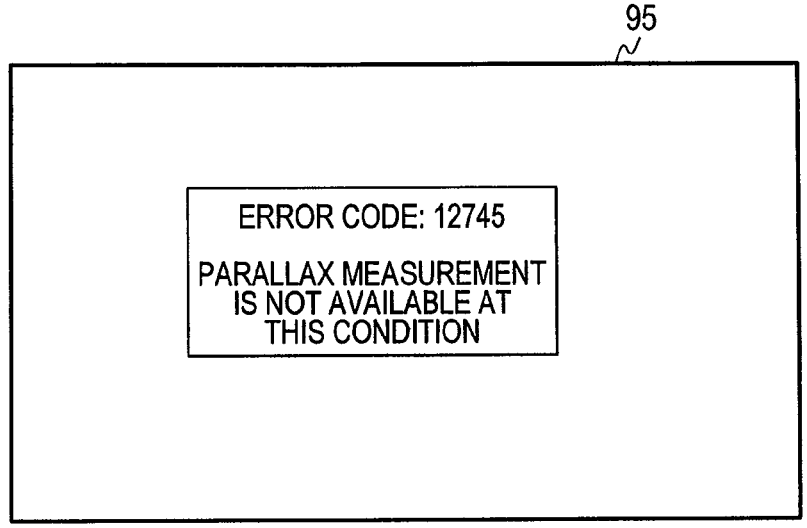
FIG. 9B is a view showing an example of a display of a warning that the screen display is not usable, according to the first embodiment.

In the present embodiment, for the management, a table 90 showing whether the parallax method can be used in accordance with the measurement condition, which is shown in FIG. 9A, may be displayed on the display unit 70. In FIG. 9A, a coefficient is adjusted with 800 V of accelerating voltage 91 and the optical mode 92 of a high resolution mode. Further, as shown in an adjustment status, the focus or the astigmatism may be corrected. But, it is also shown that in a focus depth mode at 800 V, the correction cannot be performed. Further, at 500 V, both modes can be used. However, as shown in the remark section 94, in the focus depth mode, only focus correction is available. However, the present invention is not limited to the display method and display contents, but the display function that judges whether the focus and astigmatism correction function according to the present invention is available in accordance with the usage condition of the device is an available function. In the present embodiment, when a condition that the adjustment is not available is selected, a warning message 95 of FIG. 9B is additionally displayed.

As described above, by calculation for correction of the amount of the pattern position displacement depending on the amount of the beam deflection and direction thereof, it is possible to correct astigmatism having a small amount of dose and a focus with high accuracy and evaluate (measure) a pattern with a high reproducibility. When the amount of does is not small, the irradiating time of the electron is short. Therefore, it is possible to improve the throughput of a device required for evaluation or inspection.

Further, according to the present embodiment, since there is no need to control a new machine, the error is not increased, so that it is considered that the present embodiment is advantageous. A resist line of 65 nm is measured with a reproducibility of 0.3 nm using the present embodiment.

As a result, a throughput when measuring 200 points on the wafer can be improved from three sheets per hour of a related art to six sheets per hour.

Second Embodiment

In a second embodiment, in case of correcting an astigmatism and adjusting a focus from the image acquired in two or more different directions, the amount of correction of a pattern position displacement error depending on the amount of beam deflection and a tilting direction is reflected into a beam tilting condition which is a charged particle optical system condition. Accordingly, without correcting in calculating the astigmatic difference and the amount of focus deviation, it is possible to correct the astigmatism and adjust the focus at a high speed with high accuracy. The schematic configuration of a casing of the measuring device that uses a charged particle beam according to the second embodiment is the same as that of FIG. 1.

Figure 10:
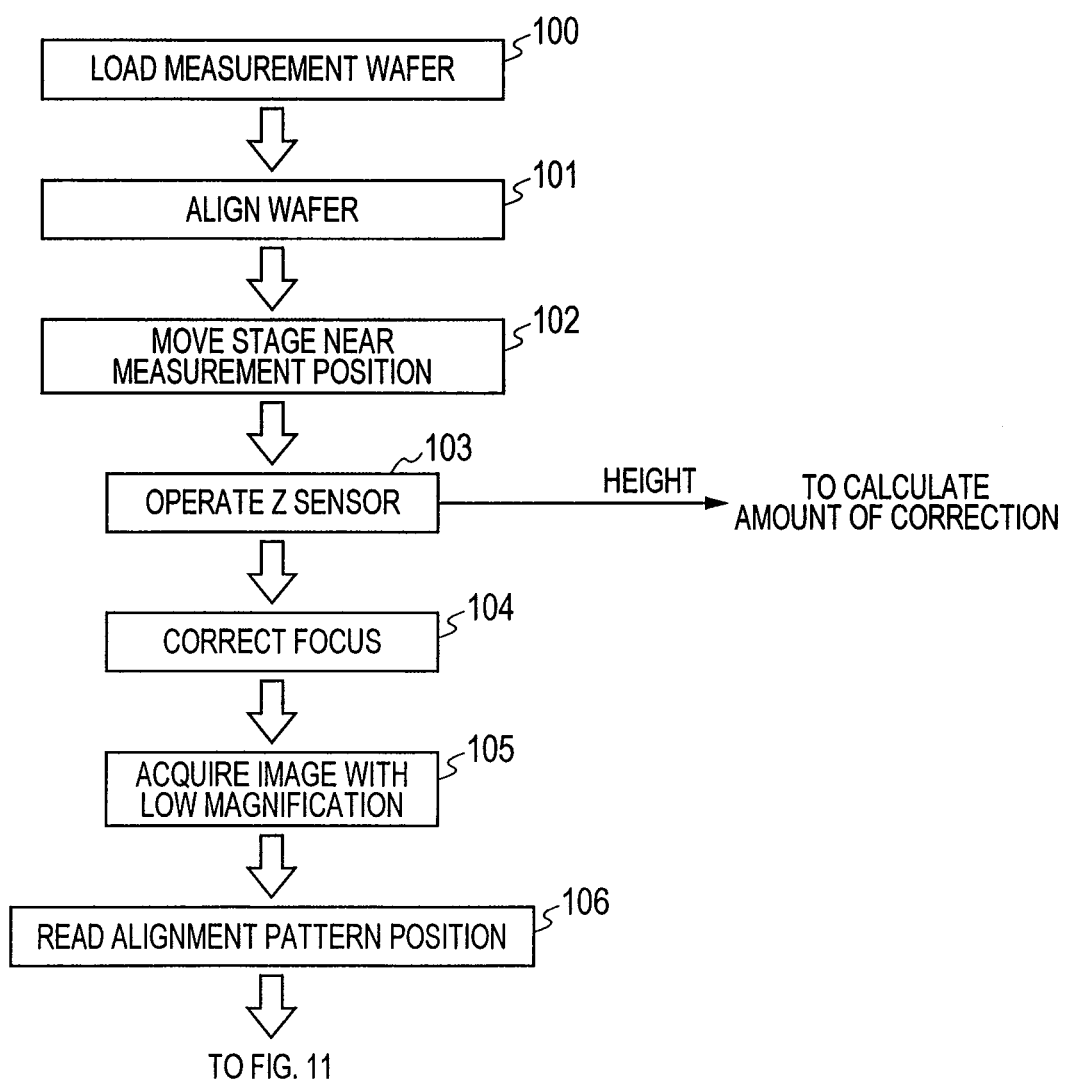
FIG. 10 is a flow chart (first part) of an automatic recipe according to a second embodiment.
Figure 11:
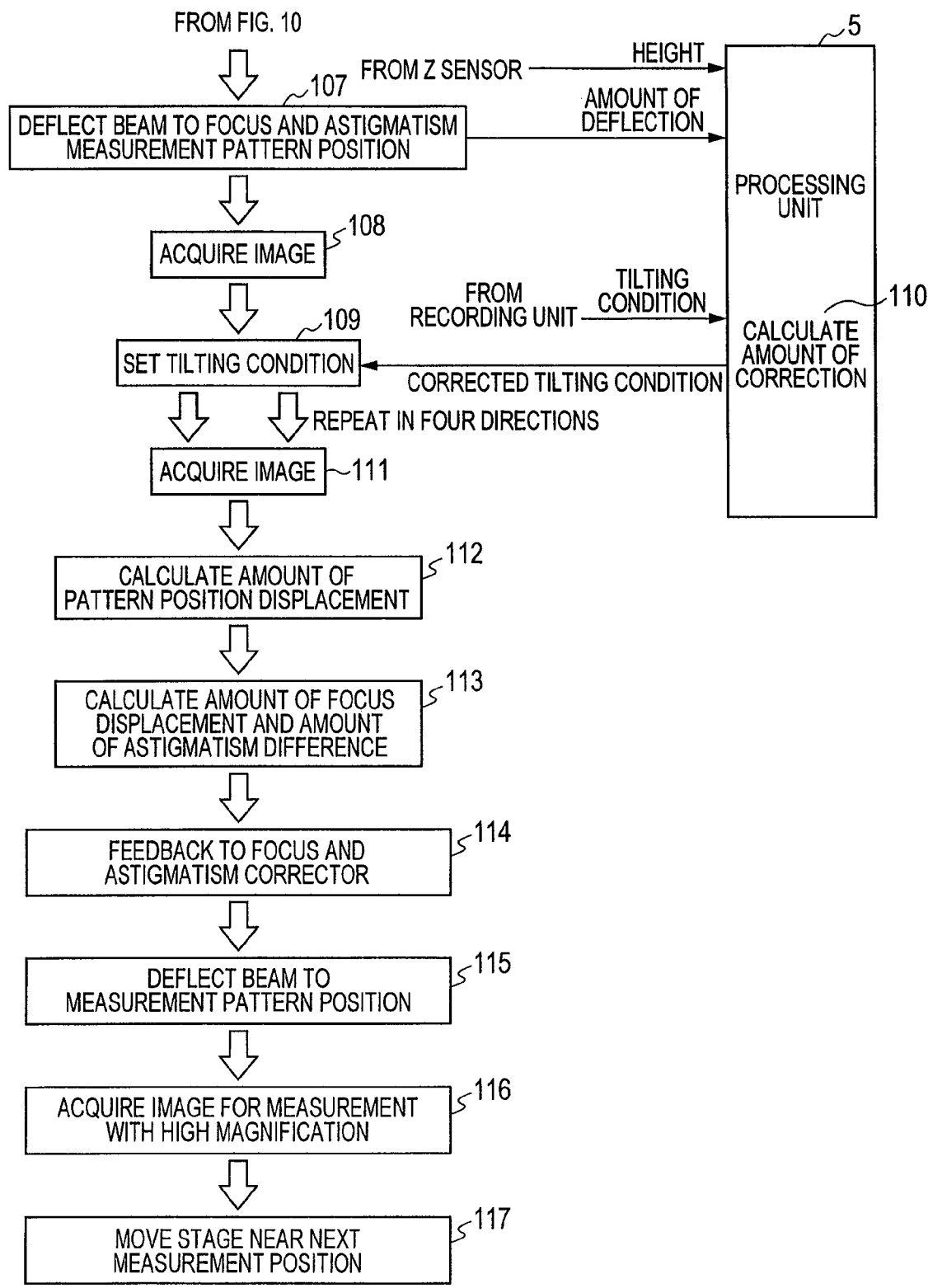
FIG. 11 is a flow chart (second part) of an automatic recipe according to the second embodiment.

FIGS. 10 and 11 show flowcharts of a recipe for automatic measurement according to the second embodiment. In the flowchart of the recipe, the steps before tilting a beam (100 to 108) are the same as those of the first embodiment (40 to 48). Next, when the beam is tilted to measure the astigmatic difference and the amount of the focus position displacement, a beam tilting condition that is a new charged particle optical system condition created by feeding back the amount of correction of the pattern position displacement depending on the amount of beam deflection and the tilting direction is used (109) and the beam is tilted in a determined direction (tilting angle and direction) by the second deflector 9a of FIG. 1 to acquire the image. Specifically, based on the tilting condition until now, the amount of beam deflection corresponding to the amount of correction of the pattern position displacement is added to be the tilting condition. As a result, the pattern position displacement depending on the amount of beam deflection and the tilting direction is corrected, so that the image is acquired in this status (111), and the amount of pattern position displacement before and after tilting the beam (parallax) is measured (112).

Since an angle of tilting the beam is 30 mrad in all directions, the amount $\Delta d$ of focus position displacement is calculated as follows.

$$\Delta d = \text{parallax} \times (1000/\text{tilted angle (mrad)}) \quad \text{[Equation 6]}$$
$$\approx \text{parallax} \times 33$$

The subsequent steps (113 to 117) are same as those of the first embodiment (steps 54 to 58).

As described above, by correcting the amount of pattern position displacement depending on the amount of beam deflection, it is possible to perform the astigmatism having a small amount of dose or focus correction method with high accuracy and to evaluate (measure) the pattern with high accuracy. Further, if the dose is small, the irradiating time of the electron is short. Therefore, the throughput of the device used for evaluation or inspection is improved. Further, as described in the present embodiment, a method for correcting the calculation result of the amount of focus deviation and the amount of astigmatic difference may be considered without reflecting the correction of the amount of the pattern position displacement into the optical system. However, in this case, the magnification to be used needs to be small in some cases. According to the focus correction and astigmatism correction by the parallax method, as the amount of correction becomes larger, the value of the parallax becomes larger, and thus, the magnification needs to be small. Furthermore, if the amount of the pattern position displacement depending on the amount of the beam deflection is added thereto, the magnification needs to be much smaller. Since the fact that the magnification is limited is disadvantageous and the size of the deflector per pixel is fixed, the measurement accuracy becomes worse as the magnification becomes smaller. Therefore, it can be seen that the present embodiment is advantageous.

A resist line of 45 nm is measured with a repeatability of 0.35 nm using the present embodiment. As a result, a throughput when measuring 100 points on the wafer can be improved from four sheets per hour of a related art to eight sheets per hour.

Third Embodiment

In a third embodiment, in case of adjusting a focus from the image acquired in two or more different directions, the amount of correction of a pattern position displacement error depending on the amount of beam deflection and a tilting direction is reflected into an acquired parallax value to calculate the amount of focus deviation. Since there is no tilting of beam in the plural directions, the focus may be adjusted at a high speed with high accuracy. The schematic configuration of a casing of the measuring device that uses a charged particle beam according to the third embodiment is the same as that of FIG. 1. In the present embodiment, only focus correction is performed without performing the astigmatism correction. The present embodiment is effective for a conductive sample (for example, silicon and the like) in which the astigmatic difference hardly occurs. Since in case of the focus position displacement without astigmatism displacement, the in-focus plane is changed only in the Z-direction (direction perpendicular to X and Y), focus may be adjusted using observation images obtained by irradiation from at least two directions, that is, two observation images obtained in a perpendicular direction and one tilted direction.

Figure 12:
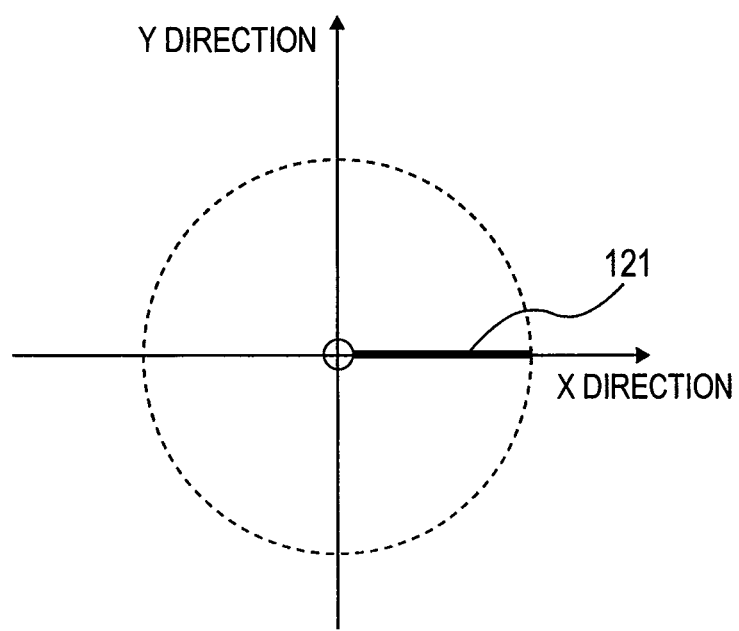
FIG. 12 is a projection view of tilted beam in one direction onto an XY plane, according to a third embodiment.

Therefore, in addition to the perpendicular beam, only a tilted beam 91 in a 0 degree direction represented by reference numeral 121 in FIG. 12 may be used, and the amount $\Delta d$ of focus position displacement is calculated as follows.

$$\Delta d2 = \text{parallax} \times (1000/\text{tilted angle (mrad)}) \quad \text{[Equation 7]}$$
$$\approx \text{parallax} \times 33$$

Figure 13:
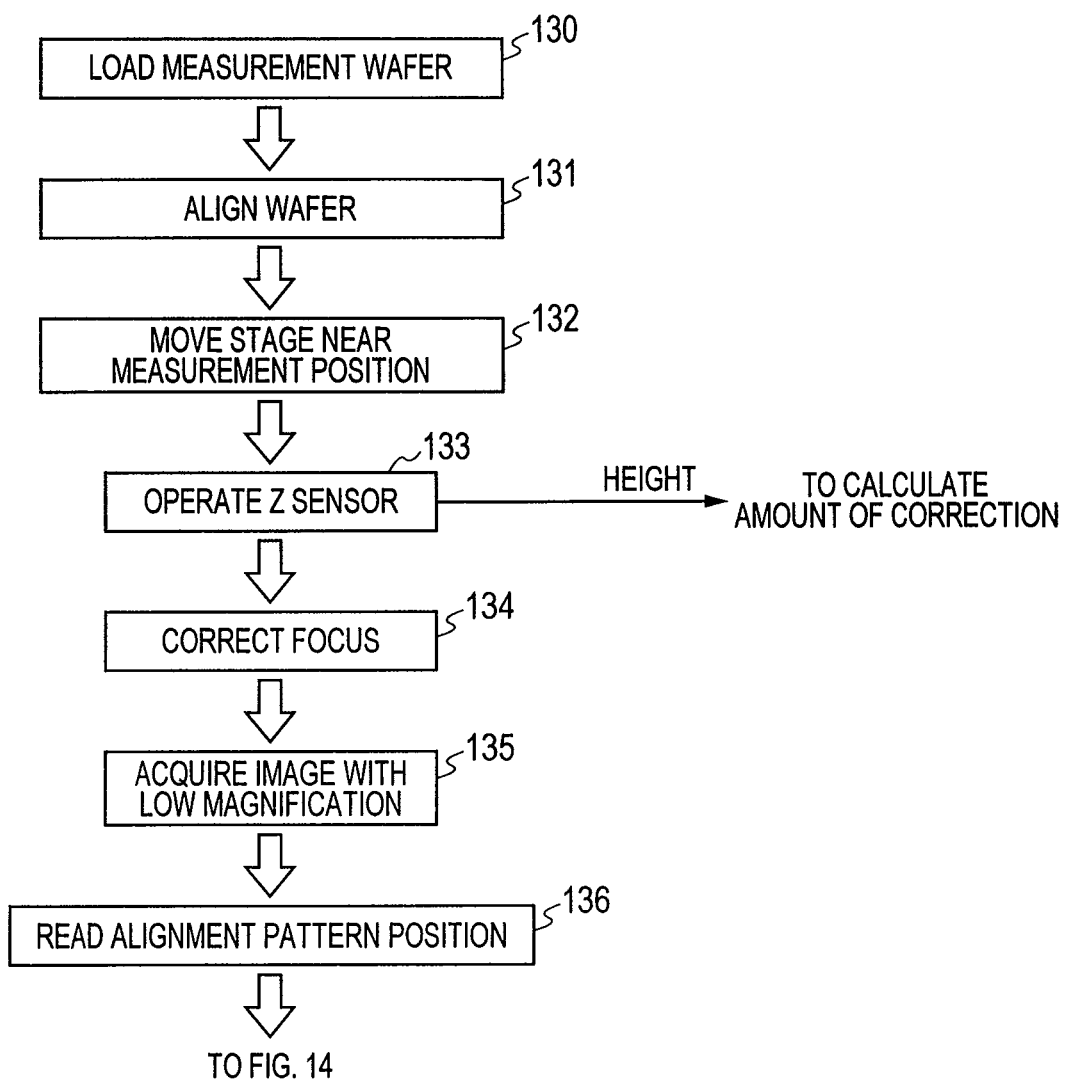
FIG. 13 is a flow chart (first part) of an automatic recipe according to the third embodiment.
Figure 14:
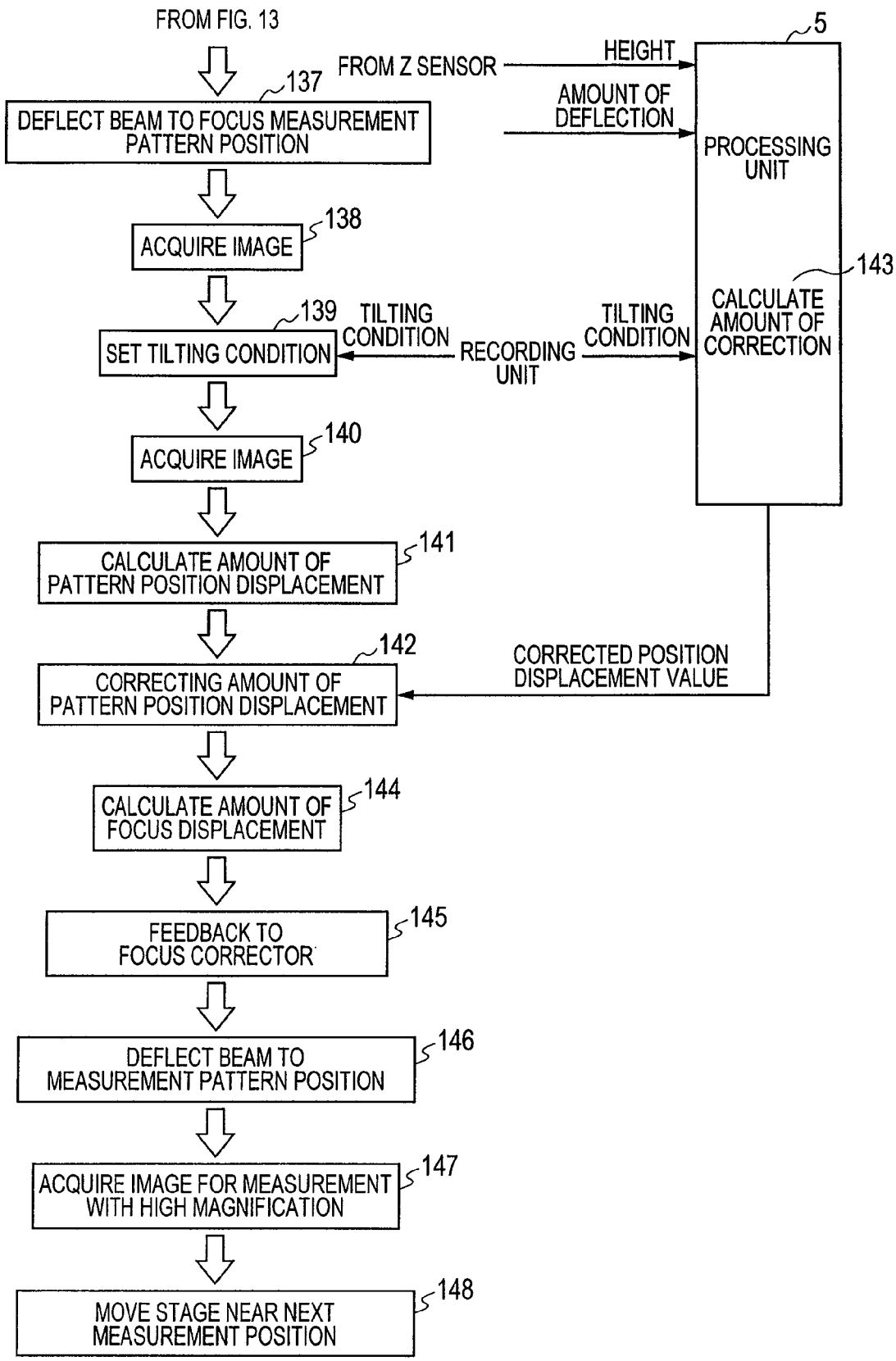
FIG. 14 is a flow chart (second part) of an automatic recipe according to the third embodiment.
Figure 15A:
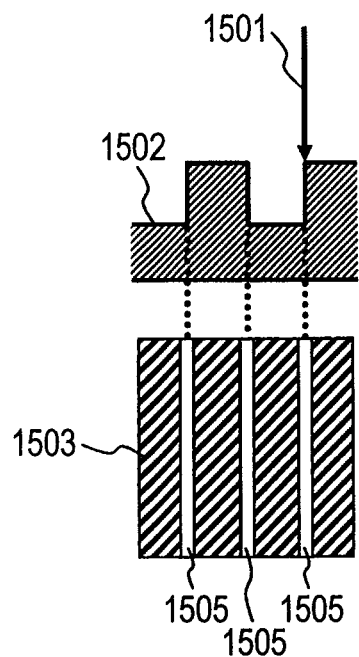
FIG. 15A is a view showing a perpendicular incidence as an example of irregularity judgment using an SEM image having different incident angles of a primary electron.
Figure 15B:
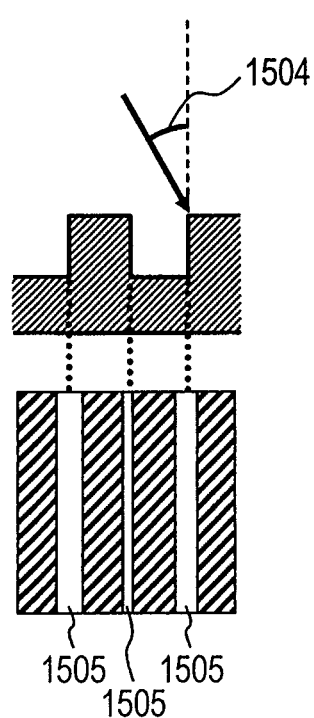
FIG. 15B is a view showing a tilted incidence as an example of irregularity judgment using an SEM image having different incident angles of a primary electron.

The focus may be adjusted by feeding this value back to the focus controller 3. Further, the flowchart of the third embodiment is shown in FIGS. 13 and 14. The respective steps (130 to 148) shown in FIGS. 13 and 14 are the same as steps 40 to 58 shown in FIGS. 4 to 5, excluding steps 137 to 145. In steps 139 and 140, since the beam tilting is not repeatedly measured in plural directions, the throughput may be improved.

A polysilicon line of 30 nm is measured with a repeatability of 0.25 nm using the present embodiment. As a result, a throughput when measuring 100 points on the wafer can be improved from eight sheets per hour only to nine sheets per hour in case that astigmatism correction is included.

Further, the above respective embodiments describe an example that the present invention is applied to the CDSEM.

However, the present invention is not limited to the CDSEM, but it is obvious that the present invention is widely effective for a scanning charged particle beam device that automatically corrects the focus deviation or the astigmatic difference such as a defect review scanning electron microscope (DRSEM) that identifies a defect on the wafer or a scanning ion microscope (SIM) that is excellent in the surface measurement and the like.

Fourth Embodiment

Further, one of the means for addressing the another objects as described above is an image acquisition method that continuously changes the incident angle of the primary electron when one sheet of SEM image is acquired to acquire an image in which regions obtained at different incident angles are continuously connected in the same image.

When the above image acquisition method is used, even though the irradiating position of the electron beam is deviated due to the change in the incident angle, since the white bands are continuously connected in the same image, it is possible to easily identify the white band corresponding to the same edge in a region obtained at different incident angle. In this method, since it is possible to judge the irregularities by obtaining at least one sheet of image, it takes only 30 ms.

Another means is a scanning electron microscope that corrects the position displacement by moving the stage or controlling the image shift deflector when the incident angle is changed, in a status where, in addition to the incident angle of the primary electron, an approximation formula that predicts the amount of position displacement using the accelerating voltage of the primary electron, the excitation of the electrostatic or electromagnetic lens, the deflection amount of the deflecting unit that deflects the electron beam, as parameters or a correction table is stored in the recording unit of the scanning electron microscope.

In the images having different incident angle acquired using the scanning electron microscope, the deviation of the electron beam irradiating position may be reduced to about several nm, such that it is possible to identify the white band corresponding to the same edge.

The fourth embodiment will be described with reference to FIGS. 17, 18A, 18B, 19, 20A, 20B, and 21.

Figure 17:
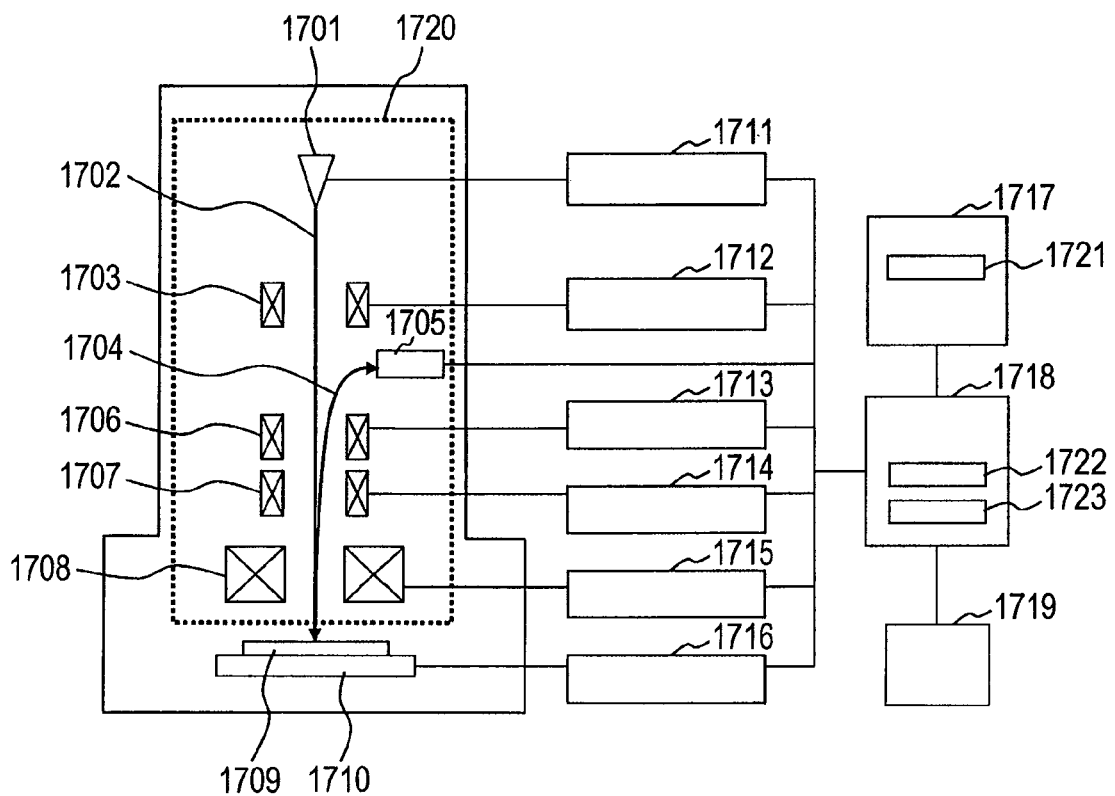
FIG. 17 is a configuration diagram of a casing of an electron microscope according to a fourth embodiment.

FIG. 17 is a configuration diagram showing main components of the scanning electron microscope of the fourth embodiment.

A primary electron beam 1702 discharged from an electron gun 1701 controlled by an electron gun controller 1711 is converged and irradiated onto a surface of a sample 1709 loaded on a stage 1710. The focus of the primary electron beam is adjusted by controlling the excitation of an objective lens 1708 by an objective lens controller 1715 or controlling the potential of the stage 1710 by the retarding voltage controller 1716. In the drawings, even though an electrostatic or electromagnetic lens other than the objective lens is omitted, in addition to the objective lens, one or plural lenses for converging the primary electron beam may be used.

A secondary electron 1704 generated from the surface of the sample by irradiating the primary electron is detected by a detector 1705.

The primary electron can be scanned on the surface of the sample by controlling a scanning deflector 1707 using a scanning deflector controller 1714. Further, an image shift deflector 1706 is controlled by an image shift deflector controller 1713 to move the irradiation range of the primary electron without moving the stage.

Further, separately to the deflector, an alignment deflector 1703 that deflects the primary electron is provided. The incident angle of the primary electron may be changed by controlling the amount of deflection using an alignment deflector controller 1712. Further, the incident angle of the primary electron may be changed using a method that uses a deflector other than the alignment deflector or a method that tilts the stage or a column 1720. In the drawings, even though deflectors other than the image shift deflector, the alignment deflector, and the scanning deflector are omitted, a deflector that deflects the primary electron for the other purpose may be provided. Further, two or more deflectors as the respective deflectors may be provided.

A control operating unit 1718 for the entire device sends a control signal to the respective controllers. Further, an intensity of a secondary electron signal obtained from the detector 1705 is displayed on a display unit 1719 in accordance with a control signal to a scanning converter controller 1714. Therefore, the SEM image may be obtained. Further, reference numeral 317 denotes a recording unit that records image data, reference numeral 1721 denotes an incident angle profile recording area, reference numeral 1722 denotes an incident angle/scanning cooperative controller, and reference numeral 1723 denotes an irregularity judgment operating unit.

Figure 18A:
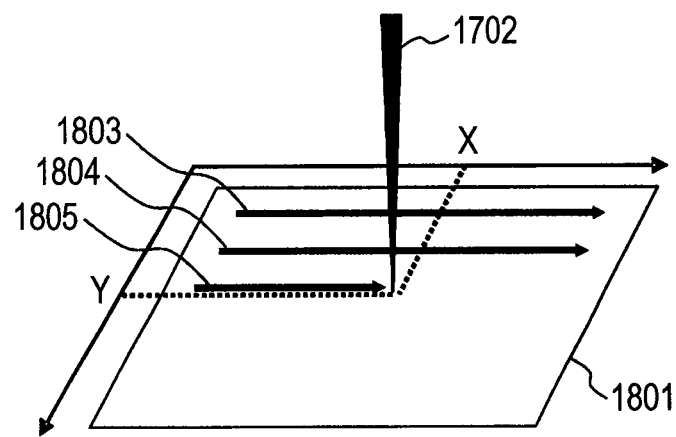
FIG. 18A is a diagram of an image acquisition method of an electron microscope according to the fourth embodiment, which shows a status where the electron beam is irradiated.

Hereinafter, a method of acquiring an SEM image will be described in detail. FIG. 18A shows an example of a method of scanning the primary electron beam 1702 when observing an area on the surface of the sample (primary electron beam irradiating area) 1801. Further, the observation area 1801 is referred to as a visual field.

FIG. 18A shows a status where the primary electron is irradiated in a position (X, Y) in the visual field by moving the scanning position to lines 1803, 1804, and 1805 in this order. Further, even though FIG. 18A illustrates a scanning method of scanning the entire visual field surface by repeatedly scanning from the left to the right (scanning in the X-direction) while shifting from the top to the bottom (Y direction) little by little, other scanning methods may also be used.

For example, the scanning direction at the time of scanning in the X-direction may be reversed (from right to left) or the scanning direction may be changed per line. Further, the scanning is not sequentially performed in 1803, 1804, and 1805, and the Y-direction, but the order of scanning lines may be changed. Using the scanning methods, it may be expected to reduce the influence of the charging of the surface of the sample caused by the irradiation of the primary electron. Using any of the scanning methods, the line scanning in the Y direction may be performed by changing the X direction and the Y direction.

Figure 18B:
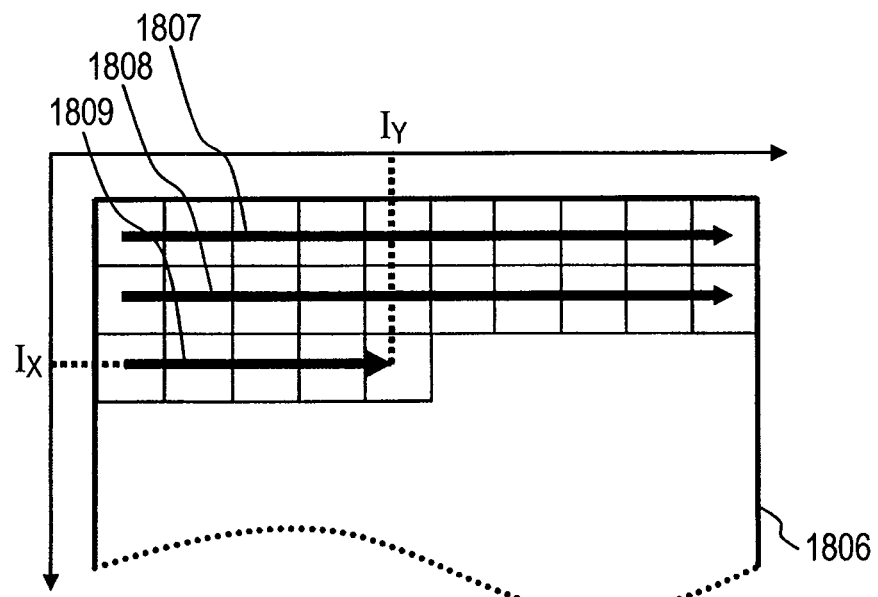
FIG. 18B is a diagram of an image acquisition method of an electron microscope according to the fourth embodiment, which shows an SEM image.

The secondary electron generated from the sample by irradiating the primary electron is detected by the detector. If the intensity of the detected secondary electron signal is represented by a brightness of pixels in the image display unit corresponding to the scanning position, the SEM image 1806 shown in FIG. 18B is acquired.

Lines 1807, 1808, and 1809 of the SEM image 1806 correspond to scanning lines 1803, 1804, and 1805 on the sample and a position (Ix, Iy) in the SEM image 1806 correspond to the position (X, Y) in the visual field. Further, even though FIG. 18B shows a small total number of SEM images for simple explanation, the number of pixels at one side is actually arbitrary, and for example, 512 pixels are used.

When the irregularities is judged, in accordance with the incident angle data stored in an incident angle profile recording area 1721 in the recording unit 1717, the image is acquired using the incident angle/scanning cooperative controller 1722 while changing the incident angle of the primary electron.

Using the electron microscope having the above configuration, the irregularities of the pattern is judged on plural points on the semiconductor wafer in which the line and space pattern is formed. FIG. 19 shows a flowchart when a width of a line pattern or a space pattern is automatically measured. Hereinafter, each step of the flowchart will be described.

First, in step 1901, an incident angle profile is determined, and then the incident angle profile is stored in the incident profile recording area 1721. The incident angle profile, as shown in FIG. 20A, refers to a relationship between an electron beam scanning position in the Y-direction when an image for performing the irregularity judgment is acquired and the incident angle of the primary electron.

The incident angle profile may be set so as to be automatically determined in accordance with the period of the pattern to be measured, the accelerating voltage of the primary electron, and the observation magnification so as to acquire an optimal tilting angle. If the optimal tilting angle is unclear, the same incident angle profile may be used every time. Further, an operator of the device may manually determine.

Thereafter, in step 1902, the irradiation position of the primary electron is moved to a location of the sample to be measured using the stage or the image shift deflector.

Next, in step 1903, with reference to the incident angle profile that is previously recorded, a control signal is sent to the alignment deflector controller 1712 and the scanning deflector controller 1714 by the incident angle/scanning cooperative controller 1722, so that the primary electron beam is scanned while changing the incident angle of the primary electron, thereby acquiring the SEM image.

Figure 20B:
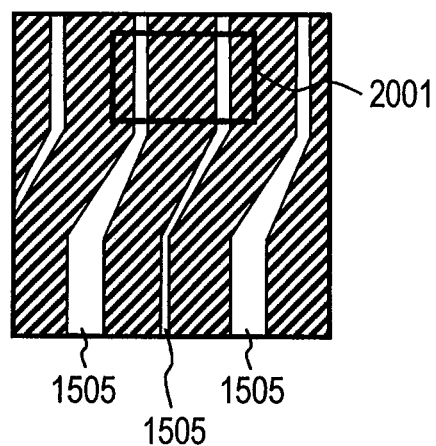
FIG. 20B is an explanatory diagram according to the fourth, fifth, and eighth embodiments, which shows an example of an acquired SEM image.

For example, in accordance with the incident angle profile shown in FIG. 20A, if the scanning is performed while changing the incident angle of the primary electron, such that the SEM image of the sample on which the line and space pattern is formed is acquired, the SEM image shown in FIG. 20B is obtained. The upper part of the SEM image is an image area acquired with the primary electron that is incident perpendicularly to the surface of the sample (incident angle: 0°), the center part is an image area acquired while changing the incident angle, and the lower part is an image area acquired by tilting at a predetermined angle, 2° in the present embodiment.

In the center part of the image, the width of the white band is changed in accordance with the tilted incident angle of the primary electron, and simultaneously, the irradiating position of the primary electron is displaced, such that the white band is tilted. Further, in the present embodiment, the variable range of the incident angle is 0° to 2°, but is not limited thereto. The width of the white band may be varied, and the maximum incident angle may be set to, for example, a value exceeding 0.1°. However, the maximum incident angle may be practically 1° to 2°.

Unlike an image for measuring a dimension, the image for judging the irregularities acquired by the above method does not need to be clear and is enough if the change in the white band can be recognized. Therefore, only one image may be acquired. Plural images are acquired and calculated, so that the S/N of the image may be improved.

Further, since the time that takes to acquire one sheet of image is generally one second or shorter, it is required to control the incident angle of the primary electron at a high speed. However, if it is difficult to control the incident angle of the primary electron at a high speed, for example, due to the reason that the response speed of the alignment deflector is not sufficient, the image acquisition time may be lengthened by lowering the scanning speed.

Further, it is described here that with respect to the line and space pattern in the vertical direction (Y-direction), the primary electron beam is line-scanned in the X-direction. With respect to a predetermined periodic pattern other than the above described pattern, if the primary electron beam is line-scanned in the same direction as the period, the same SEM image may be acquired.

For example, with respect to the line and space pattern in the horizontal direction (X-direction), the primary electron beam may be line-scanned in the Y-direction. In this case, the incident angle profile is a relationship between the scanning position in the X-direction and the incident angle of the primary electron.

In step 1904, the SEM image acquired in step 1903 is analyzed by the irregularity judgment operating unit 1723 while referring to the incident angle profile stored in the recording area 1721, thereby judging the irregularities.

Figure 21:
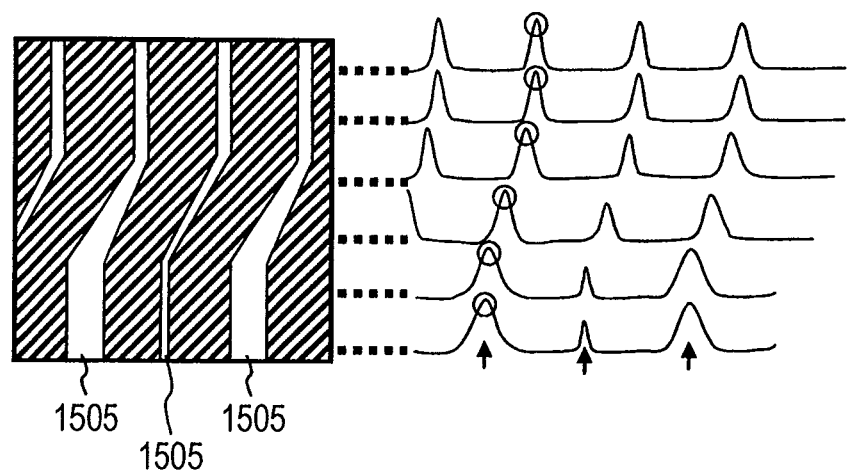
FIG. 21 is a diagram illustrating a method for identifying a white band corresponding to the same edge on a surface of a sample in the SEM image acquired in the fourth, fifth, and eighth embodiments.

At first, in the SEM image, from the white bands of the image area (upper part of the image) acquired with the perpendicularly incident primary electron and the image area (lower part of the image) acquired by being incident tilted, the white band corresponding to the same edge of the sample is identified. In the SEM image, the white bands corresponding to the same edge of the sample are connected to each other and the identification is possible by the below method. First, as shown in FIG. 21, intensity of the secondary electron signal in a horizontal line of the acquired SEM image is plotted, which is referred to as secondary electron profile hereinafter. In the drawing, only the secondary electron profile in the horizontal line is shown.

Further, a peak position of the secondary electron profile in respective lines is obtained. Before performing the above process, the secondary electron profiles in plural lines may be averaged to improve the S/N. Further, instead of using the secondary electron profiles in all lines, some lines may be extracted to use only secondary electron profiles thereof as shown in FIG. 21.

Next, any one peak of the secondary electron profiles is selected and a peak at the closest position in the secondary electron profiles in horizontal lines adjacent up and down is determined, thereby determining the peak as a peak corresponding to the same edge. By repeating the above process, a peak corresponding to the same edge of the upper part and the lower part of the image may be determined as shown by circles in FIG. 21.

In the above process, when a peak position may not be detected in the secondary electron profile of any horizontal line or the distance from the closest peak in the secondary electron profiles in adjacent horizontal lines is larger than a predetermined ratio with respect to the period of the sample pattern, it is determined that the identification of the peak fails and the first selected pick may be set as a different one to perform the above process again.

After identifying the peak corresponding to the same edge, the irregularities are judged. Specifically, the peak widths of peaks corresponding to the same edge in the secondary electron profile of the vertically incident area (upper part of the image) and the tilted incident area (lower part of the image) are compared.

It is understood that as compared with the vertically incident area, the peak width of the tilted incident area is large in the peaks denoted by the circles of FIG. 21 and at the time of being incident tilted, the primary electron is contacted with a side wall. That is, the left side of the peak denoted by the circle (a side where the primary electron is tilted) may be judged as a concave.

As described above, instead of indexing the increase in the peak width, the increase in the peak intensity may be indexed. Further, both may be used. Further, if there are plural white bands in the SEM image, instead of judging the irregularities from the peak corresponding to one edge, irregularities are judged similarly with respect to the plural adjacent edges. It is possible to improve the accuracy of the judgment considering that concaves and convexes of the sample pattern for every edge are repeated.

In order to determine the peak width, a half width where the peak intensity is 50% of the maximum value or a reference that is separately defined but not 50% may be used. Otherwise, by determining the peak width and the peak intensity by fitting using a Gauss function and the like, it is possible to reduce the influence thereof even when the S/N of the image is bad and thus a large noise exists in the secondary electron profile.

As described above, in addition to a method of judging the irregularities by comparing peaks corresponding to the same edge in the secondary electron profile of different lines, it is possible to judge irregularities by comparing different peaks in the secondary electron profile of the same line in the tilted incident area. In this case, the width or the intensity of the peak in the secondary electron profile alternately and repeatedly becomes small and large, and a direction of the incident angle of the primary electron as seen from a peak having a large peak width (or large intensity) may be determined as a concave.

For example, when the peaks shown by an arrow in FIG. 21 are compared, the widths of the first and third peaks from the left are large and the left side (a side where the incident angle of the primary electron is tilted) may be determined as a concave.

Further, the incident angle profile illustrated in FIG. 20A is only an example. If the incident angle of the primary electron is changed from one incident angle to the other incident angle, it is possible to judge the irregularities in any incident angle profile. For example, the profile may be configured only by an area where the incident angle of the primary electron is changed such as a center area of FIG. 20A. Further, the incident angle is not changed between two different values as shown in FIG. 20A, but may be changed between three or more different values. Further, the change in the incident angle may not be in one direction.

Further, not only a method that compares two secondary electron profiles as described above, but also a method that obtains the correlation between the intensity or width of a peak corresponding to the same edge in three or more secondary electron profiles and the incident angle may be available. When the intensity or the width of the peak is increased in accordance with the tilting of the incident angle, the direction where the incident angle becomes tilted as seen from the peak may be judged as a concave.

In the judgment of the irregularities, it is determined whether the judgment of irregularities succeeds or fails. If the irregularity judgment fails, the branch on condition may be set so as to change the incident angle profile to attempt to judge irregularities again. Otherwise, the branch may be set to move to the next measurement point without measuring at the measurement point. By performing the error processing described above, it is possible to increase the reliability of the result of the dimension measurement after judging the irregularities.

In order to determine whether the irregularity judgment succeeds or fails, a method described below may be considered. First, when the size of the peak width or the intensity of the peak is compared, if the difference is smaller than a threshold value, it is determined that the irregularity judgment fails. Otherwise, in case of a method that obtains the correlation between the intensity or the width of the peak corresponding to the same edge and the incident angle, if a correlation coefficient is smaller than a predetermined threshold value, it is determined that the irregularity judgment fails.

Figure 16:
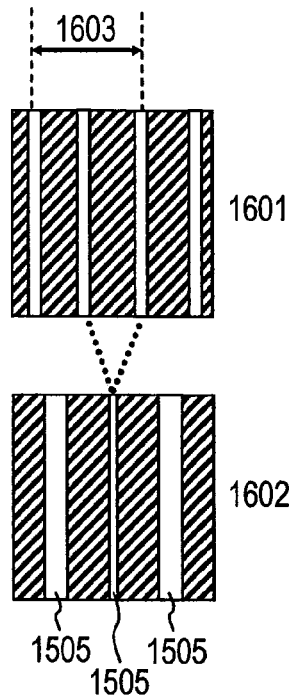
FIG. 16 is a view illustrating an example of an SEM image in which the irregularity judgment is not possible due to the movement of the irradiation position of the primary electron.

After judging the irregularities, in step 1905, an SEM image for dimension measurement is acquired by making the incident angle of the primary electron perpendicular. Among the SEM images of FIG. 20B, the upper parts are areas acquired with perpendicularly incident primary electron. Therefore, if the SEM image for dimension measurement is acquired with a perpendicularly incident primary electron without changing the sample position, as shown by 1601 in FIG. 16, an image formed with four parallel white bands is acquired.

Among the white bands, since the second white band from the left corresponds to a peak denoted by a circle in FIG. 21, from the result of the irregularity determination described above, it may be determined that the left side of the second white band from the left is a concave of the pattern formed on the sample, that is, a space part. If necessary, the result of the irregularity judgment may be displayed on the display unit separately from the SEM image or a marker indicating the irregularities in the SEM image may be displayed.

By doing so, the result of the irregularity judgment may be sequentially checked by the operator. Further, when the SEM image is stored in the recording unit, the result of the irregularity judgment may be stored separately from the image data and the image data marked with the above marker may be stored. Accordingly, the result of the irregularity judgment may be referred later.

After judging the irregularities of the sample pattern on the SEM image, a dimension of a target pattern is measured (1906). For example, when a line width is measured, an interval between the second white band and the third white band from the left may be measured. An algorism that calculates a line width by measuring the interval of the white bands may be an algorism that has been used in the related art. The same applies to the measurement of the space width.

Further, additional image can be acquired with perpendicularly incident primary electron because a resolution of the SEM image acquired with tilted incidence is higher than that of the SEM acquired with perpendicular incidence, such that it is possible to measure the dimension with high accuracy.

By the procedures described above, measurement for one point is completed. Thereafter, with movement to another measurement point, the same sequence is repeated until measurement for all set measurement points is completed and then the measurement is completed.

As described above, in the present embodiment, the irregularities of the sample pattern are simply judged and the dimension of the line and space pattern may be automatically measured.

In the measurement of the dimension of the line and space pattern according to the related art, complicated processes for irregularity judgment is required, for example, plural images having different incident angles of the primary electron are acquired to judge the irregularities or estimate the irregularities at the measurement points by counting the number of white bands from the pattern edge to the measurement point.

Further, it takes time for measurement. However, according to the present embodiment, it is possible to improve the throughput.

Further, even though the flowchart shown in FIG. 19 shows only steps relating to judging the irregularities and measuring a dimension of the pattern, there may be a step of adjusting a focus or a step of correcting the irradiating position of the primary electron by detecting the position of a pattern on the previously registered sample in order to precisely match the irradiating position with a position on the sample.

According to the fourth embodiment describe above, it is possible to provide an electron beam device that is capable of judging the irregularities of a periodic pattern formed on a substrate in a short time.

Fifth Embodiment

A fifth embodiment will be described with reference to FIGS. 20A, 20B, and 22. Further, the matters that are described in the fourth embodiment, but not described in the present embodiment, are same as the fourth embodiment.

Figure 22:
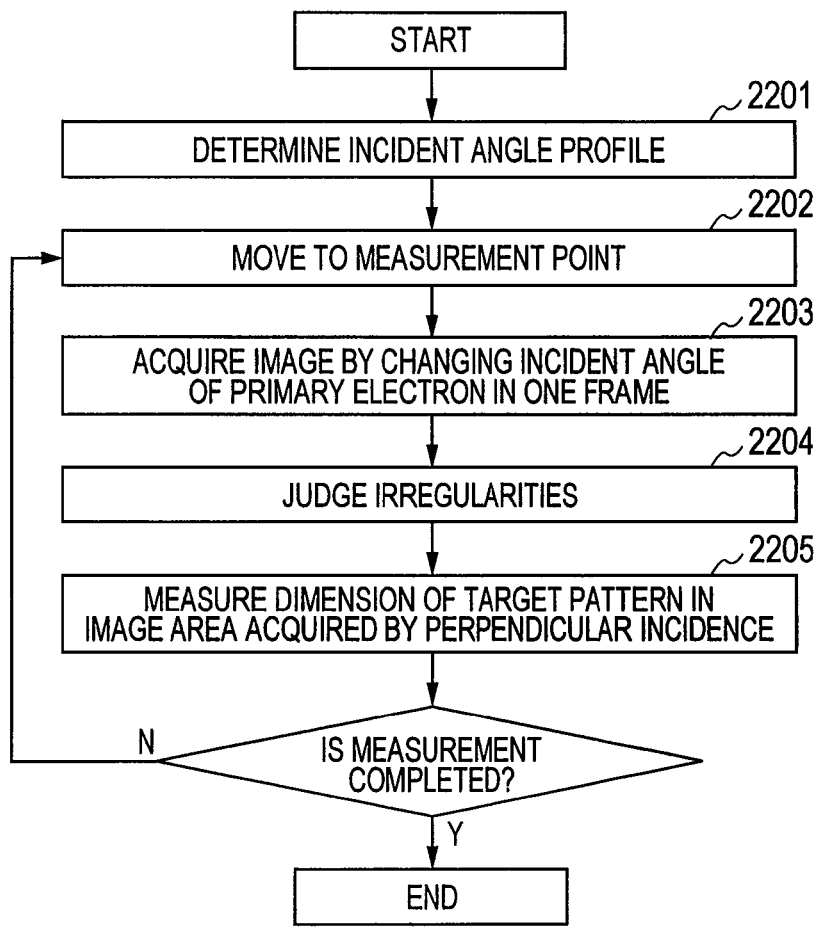
FIG. 22 is a flowchart of automatic dimension measurement of a sample pattern according to a fifth embodiment.

FIG. 22 is a flowchart, which is different from the fourth embodiment, when the dimension of the line and space pattern is measured using the present embodiment.

The fourth embodiment is a method of acquiring an SEM image that measures the dimension of the pattern separately from the SEM image used for irregularity judgment. In the meantime, the present embodiment is a method that also measures the dimension of the pattern using an image used for the irregularity judgment. In the present embodiment, a partial area of the SEM image that is used for irregularity judgment is acquired with a perpendicularly incident primary electron. Further, the dimension of the pattern in the image area in the acquired image acquired with the perpendicularly incident primary electron is measured.

For example, the incident angle profile of FIG. 20A illustrated in the fourth embodiment includes a perpendicularly incident area, which may be used for the present embodiment. Here, an example that in accordance with the incident angle profile, similarly to the fourth embodiment, the SEM image is acquired by performing scanning while changing the incident angle of the primary electron using the incident angle/scanning cooperative controller, and a dimension of the line width is measured using the acquired SEM image shown in FIG. 20B is described.

Steps 2201 and 2202 are same as steps 1901 and 1902 of the fourth embodiment. In next step 2203, it is recorded which area of the image is acquired with the perpendicularly incident primary electron when the SEM image is acquired, which is preferable if the incident angle profile is stored in the incident angle profile recording area and then will be referred later. Otherwise, by a method that writes a marker indicating the perpendicularly incident area in the image stored in the image recording area, the perpendicularly incident area may be shown only by the image data. Accompanied with the image data, exclusive data that records the perpendicularly incident area may be stored. In FIG. 20B, the upper part is an area acquired with the perpendicularly incident primary electron. This area is stored so as to be referenced as a perpendicularly incident area later.

In step 2204, similarly to step 1904, the irregularities are judged by the irregularity judgment operating unit, and in step 2205, the dimension of a target pattern is measured. By the method described in the fourth embodiment, it may be judged that a portion between the second white band and the third white band from the right side is a convex, that is, a line. Therefore, when the line width is measured, in the image area previously stored where the incident angle of the primary electron is perpendicular, the interval between the white bands at both sides of a part judged as a line may be measured. For example, by measuring the interval of the white bands of an area 2001 surrounded by a solid line in FIG. 20B, the line width may be measured.

As describe above, the dimension is sufficiently measured if there are image data in an area where the incident angle of the primary electron is 90 degree and the result of irregularity judgment. Therefore, if it is required to save the capacity of a memory, without storing the entire area of the acquired image, only the image area where the incident angle of the primary electron is 90 degree is combined to be combined with the result of irregularity judgment to be stored.

According to the present embodiment, it is possible to provide an electron beam device that is capable of judging the irregularities of a periodic pattern formed on a substrate in a short time. Further, it is possible to provide an electron beam device that is capable of judging the irregularities and measuring the dimension only by acquiring only one sheet of image to further improve the throughput.

Sixth Embodiment

A sixth embodiment will be described with reference to FIGS. 23 and 24. Further, the matters that are described in the fourth and fifth embodiments, but not described in the present embodiment, are the same as the fourth and fifth embodiments.

The present embodiment judges the irregularities using a method that is different from the methods described in the fourth and fifth embodiments. In the present embodiment, the amount of irradiating position displacement of the primary electron is estimated from an incident angle of the primary electron, an accelerating voltage of the primary electron, excitation of the objective lens, and the amount of deflection of the image shift deflector, and the irradiating position of the primary electron is corrected only by the amount of position displacement estimated when the incident angle of the primary electron is changed. Further, plural images having different incident angles of the primary electron are acquired, and then compared to perform irregularity judgment and measure the dimension of the target pattern.

Figure 23:
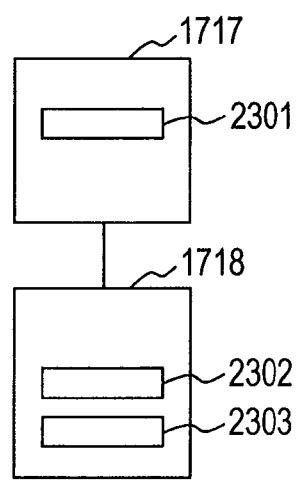
FIG. 23 is a schematic view showing a configuration of a memory unit and a controlling and operating unit of an electron microscope according to a sixth embodiment.

In order to perform the present embodiment, among the configuration of FIG. 17, the control operating unit and the recording unit of the entire device need to be changed to a configuration as shown in FIG. 23 that includes a position displacement approximation formula recording area 2301, a position displacement estimation operating unit 2302, and a position displacement correction controller 2303.

Figure 24:
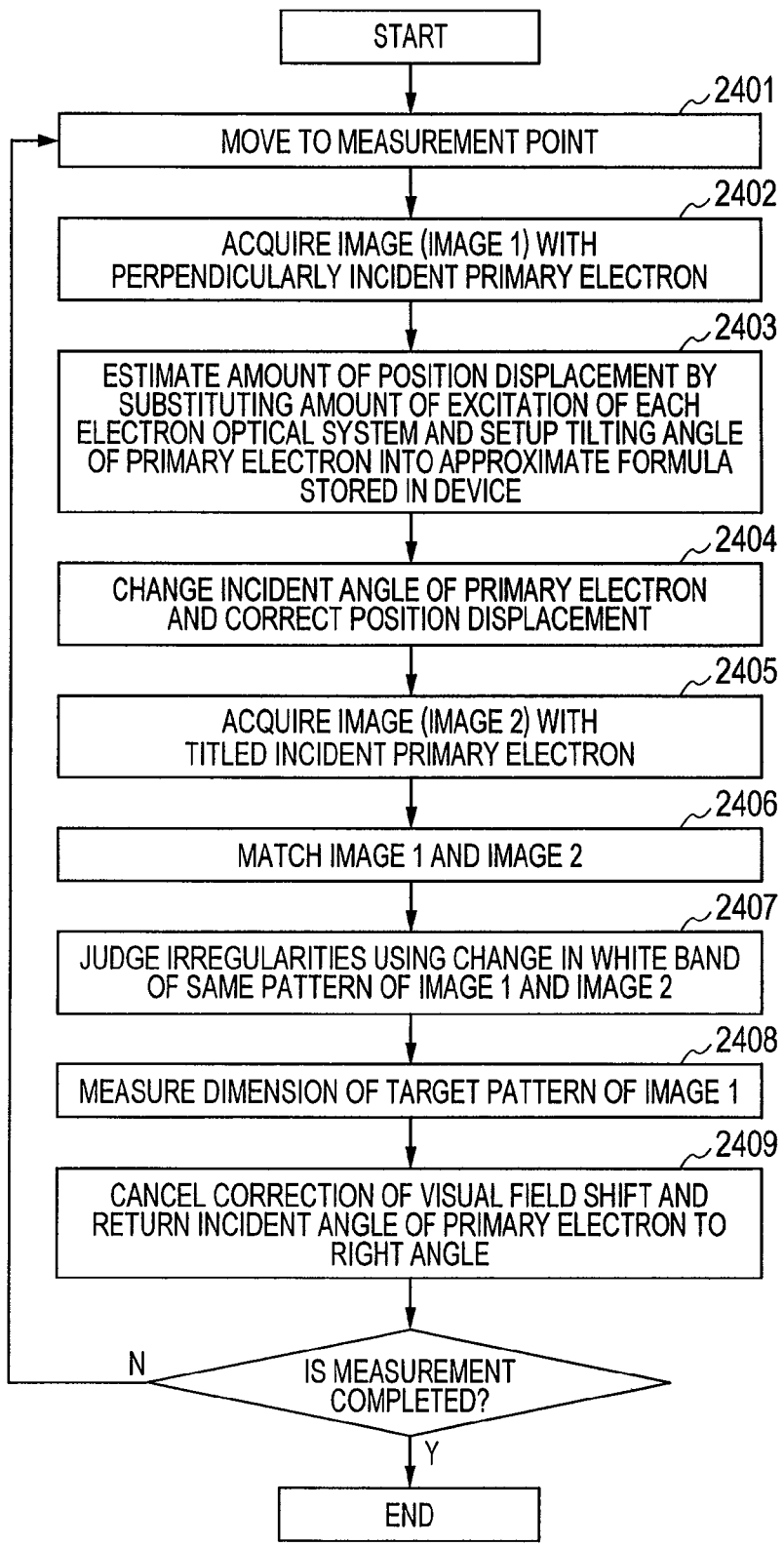
FIG. 24 is a flowchart of automatic dimension measurement of a sample pattern according to the sixth embodiment.

FIG. 24 shows a flowchart when the irregularities of the pattern is judged on plural points on the semiconductor wafer in which the line and space pattern is formed and the width of the line pattern or the space pattern is automatically measured, using the scanning electron microscope having the configuration shown FIGS. 17 and 23. Hereinafter, each step of the flowchart will be described.

First, in step 2401, the irradiating position of the primary electron is moved to a location where the sample is measured, using a stage or an image shift deflector.

In step 2402, the SEM image is acquired with perpendicularly incident primary electron, which is referred to as an image 1.

Next, in step 2403, the position displacement operating unit is used to calculate an estimation value of the amount of the irradiating position displacement of the primary electron by putting the accelerating voltage of the primary electron, the excitation of the objective lens, the amount of deflection of the image shift deflector, and the incident angle of the primary electron tilted in the next step into the approximation formula stored in the position displacement approximation formula recording area.

Further, a value stored in the memory unit may be used as a tilted angle of the primary electron. An input widow is displayed on the display unit and an operator may input the tilted angle. Further, when the amount of position displacement is estimated, instead of using a method that uses an approximation formula defined in advance, a method that a correction table that records the amount of position displacement under various conditions in the memory unit is stored and then refers to the table may be used.

Thereafter, in step 2404, the alignment deflector is controlled to tilt the incident angle of the primary electron at a set angle, and a control signal is sent from the position displacement correction controller to the image shift deflector controller so as to deflect the primary electron by an amount that the amount of estimated position displacement is inversed positive to negative or negative to positive, such that the irradiating position of the primary electron is moved so as to offset the position displacement. Further, the offset of the estimated position displacement may be performed by moving the stage.

In step 2405, an SEM image is acquired with the incident primary electron tilted with respect to the sample. This SEM image is referred to as an image 2.

In step 2406, the matching of the image 1 acquired with the perpendicularly incident primary electron and the image 2 acquired with tilted incident primary electron with is performed. Since the above position displacement is corrected for the image 1 and the image 2, position displacement hardly occurs. Therefore, the white bands corresponding to the same edge by the matching may be identified.

If the peak corresponding to the same edge may be identified, the sequence proceeds to step 2407 and the irregularities of the sample pattern in the image 1 are judged by the method described in the fourth embodiment. When the white bands corresponding to the same edge are compared, if the width of the white band in the image 2 acquired with the tilted primary electron is larger than the width of the white band in the image 1 acquired with the perpendicularly incident primary electron, it can be seen that the primary electron is contacted with a side wall of the edge corresponding to the white band at the time when the incident primary electron is tilted. That is, a side where the primary electron is tilted as seen from the white band may be judged as a concave.

Instead of increasing the width of the white band, the increase in the peak intensity may be indexed. Or both methods may be used. Further, when there are plural white bands in the SEM image, instead of judging the irregularities by paying attention to the white band corresponding to one edge, the irregularities are judged for plural adjacent edges in the same way and it is possible to improve the accuracy of the judgment considering that convexes and concaves of the sample pattern for every edge are repeated.

Further, instead of comparing the white bands corresponding to the same edge as shown in the above, the irregularities may be judged by comparing the adjacent white bands of the image 2. In this case, the width of the white band or the peak intensity alternately and repeatedly becomes small and large, and a side where the incident angle of the primary electron is tilted as seen from a peak having a large width (or large intensity) may be judged as a concave. There is almost no irradiating position displacement of the primary electron between the image 1 and the image 2. Therefore, if it is possible to judge the irregularities in the image 2, it is also possible to judge the irregularities for the sample pattern in the image 1.

If it is possible to judge the irregularities in the image 1, it may be understood which part of the image 1 corresponds to the line of the sample pattern and which part corresponds to the space, and therefore in step 2408, the dimension of the target pattern may be measured.

In final step 2409, the change in the incident angle of the primary electron performed in step 2404 and the correction of the position displacement are cancelled. Therefore, the measurement at one point is completed.

When the measurement at one point is completed, the sequence moves to another measurement point and then the same sequence is repeated until the measurement for all set measurement points is completed.

By using the present embodiment as described above, it is possible to automatically and precisely measure the dimension of the line and space pattern with a predetermined accelerating voltage of the primary electron, the excitation of the objective lens, and the amount of deflection of the image shift deflector.

According to the present embodiment, it is possible to provide an electron beam device that is capable of judging the irregularities of a periodic pattern formed on a substrate in a short time. Further, it is possible to provide the electron beam device that is capable of judging the irregularities under a certain optical condition.

Seventh Embodiment

A seventh embodiment will be described with reference to FIGS. 25 and 26. Further, the matters that are described in any of the fourth to sixth embodiments, but not described in the present embodiment, are the same as the fourth to sixth embodiments.

The seventh embodiment relates to a method that estimates the amount of position displacement, and controls the image shift deflector so as to offset the position displacement. However, the present embodiment does not perform the correction. Instead of correction, the amount of position displacement is considered when the image 1 acquired with the perpendicularly incident primary electron and the image 2 acquired with the tilted incident primary electron match each other.

Figure 25:
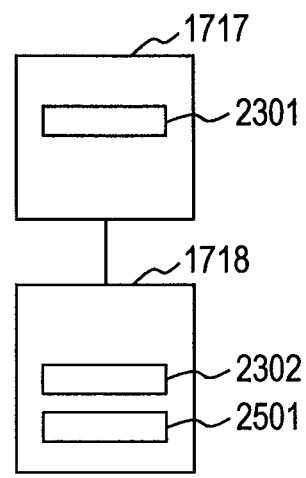
FIG. 25 is a schematic view showing a configuration of a memory unit and a controlling and operating unit of an electron microscope according to a seventh embodiment.

In order to implement the present embodiment, among the configurations of FIG. 17, the control operating unit and the recording unit of the entire device need to be changed as shown in FIG. 25. A position displacement approximation formula recording area 2301 and the position displacement estimation operating unit 2302 are the same as those of the sixth embodiment and a position displacement correction matching operating unit 2501 is additionally provided.

Figure 26:
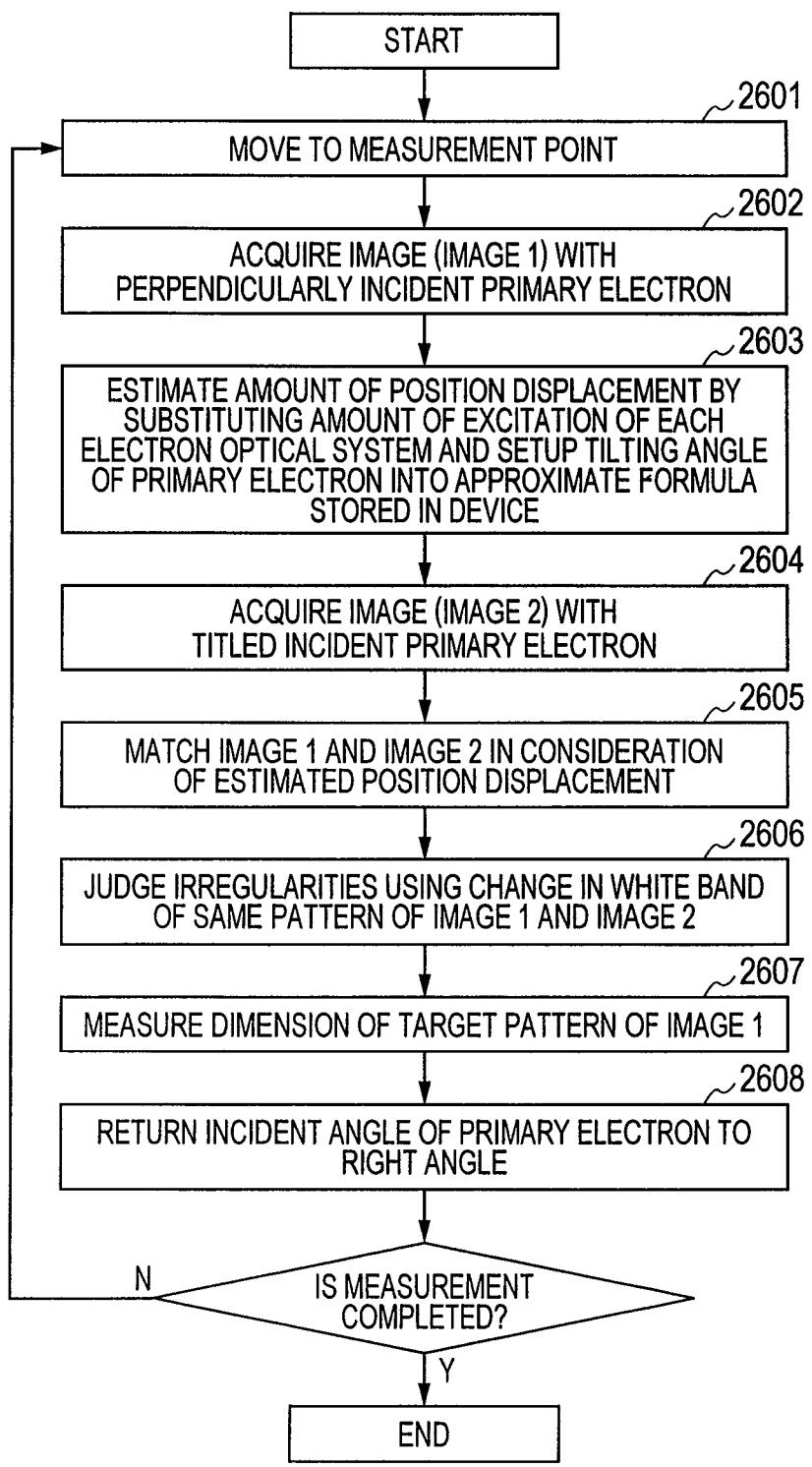
FIG. 26 is a flowchart of automatic dimension measurement of a sample pattern according to the seventh embodiment.

FIG. 26 is a flowchart of another embodiment that estimates the amount of the irradiating position displacement of the primary electron. Hereinafter, each step of the flowchart will be described.

Steps 2601, 2602, and S2603 are the same as steps 2401, 2402, and 2403 of the sixth embodiment. Thereafter, in step 2604, the incident angle of the primary electron is changed without correcting the position displacement to acquire the image 2. In step 2605, the image 1 and the image 2 match each other using the position displacement correction matching operating unit. However, in this case, the position displacement estimated in step S2603 is considered for matching the images.

Specifically, after performing the image processing that moves the image by an amount of the estimated position displacement for any of the images, the matching is performed. Otherwise, when a white band to be matched with a specific white band of one image is determined from some white bands of the other image, a method that selects a white band so that the positional difference on the image is the closest to the amount of estimated position displacement may be used.

By using the above method, without correcting the position displacement using the image shift deflector, a white band corresponding to the same edge in the image 1 and the image 2 may be identified, such that it is possible to judge the irregularities.

If the white band may be identified, similarly to steps 2407 and 2408 of the sixth embodiment, the irregularities are judged in step 2606. In step 2607, the dimension of the target pattern is measured. Finally, in step 2608, the incident angle of the primary electron is returned to the right angle and the measurement at one point is completed.

When the measurement at one point is completed, the sequence moves to another measurement point and then the same sequence is repeated until the measurement for all set measurement points is completed.

Even by using the present embodiment as described above, it is possible to automatically and precisely measure the dimension of the line and space pattern with an accelerating voltage of a certain primary electron, the excitation of the objective lens, and the amount of deflection of the image shift deflector. The present embodiment may not be applied to a case when a white band corresponding to the same edge of the image 1 and the image 2 does not exist because the amount of the position displacement is too big. On the contrary, the present embodiment is advantageous in that the image displacement correction controller, which is required in the sixth embodiment, does not need to be provided and the present embodiment may be implemented only using the operating unit.

According to the present embodiment, it is possible to provide an electron beam device that is capable of measuring the irregularities of a periodic pattern formed on a substrate in a short time. Further, it is possible to provide an electron beam device that is capable of judging the irregularities under a certain optical condition.

Eighth Embodiment

An eighth embodiment will be described with reference to FIGS. 27 and 28. Further, the matters that are described in any of the fourth to seventh embodiments, but not described in the present embodiment, are the same as the embodiments.

The present embodiment is a method that is combined with the method of correcting the position displacement described in the sixth embodiment when one sheet of SEM image is acquired while continuously changing the incident angle of the primary electron in the fourth and fifth embodiments.

In the fourth and fifth embodiments, as shown in FIG. 20B, the position displacement becomes larger as the incident angle is changed larger. In the meantime, in order to identify the peak in the method shown in FIG. 21, the amount of irradiating position displacement of the electron beam by the change in the incident angle of the primary electron needs to be smaller than the size of the visual field. Therefore, there is an upper limit for an available amount of change in the incident angle. Accordingly, when the ratio of the irradiating position displacement of the electron beam with respect to the amount of change in the incident angle of the primary electron is large, if the fourth and fifth embodiments are performed with a high magnification in which the visual field becomes narrow, an available amount of change in the incident angle of the primary electron becomes small.

If the amount of change in the incident angle of the primary electron is small, the change in the width of the peak or the peak intensity shown in FIG. 21 is correspondingly small. As a result, the accuracy of the irregularity judgment is degraded. When it is determined whether the irregularity judgment succeeds or fails by setting a threshold value in the amount of change in the peak width or peak intensity, a success rate is lowered.

In this regard, in the present embodiment, by correcting the irradiating position displacement of the primary electron using the method described in the sixth embodiment, it is possible to significantly reduce the movement of the pattern on the image due to the change in the incident angle.

Figure 27:
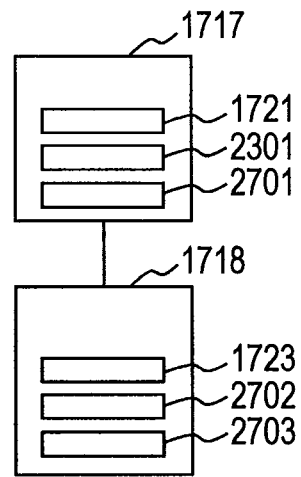
FIG. 27 is a schematic view showing a configuration of a memory unit and a controlling and operating unit of an electron microscope according to an eighth embodiment.

In order to implement the present embodiment, among the configurations of FIG. 17, the control operating unit and the recording unit of the entire device need to be changed as shown in FIG. 27. The incident angle profile recording area 1721 and the irregularity judgment operating unit 1723 are the same as those of the fourth embodiment, and the position displacement approximation formula recording area 2301 is the same as that of the sixth embodiment. In addition thereto, a position displacement amount profile recording area 2701, a positional displacement amount profile estimation operating unit 2702, and an incident angle/image shift/scanning cooperative controller 2703 may be provided.

Before step 1903 when the fourth embodiment and the sixth embodiment are combined, or before step 2203 when the fifth embodiment is used, a step of estimating a position displacement amount profile is inserted. The position displacement amount profile refers to an amount of position displacement (position displacement) in the respective scanning positions as shown in the right side of FIG. 28. Here, the position displacement amount profile estimation operating unit 2702 is used to calculate the position displacement amount profile from an incident angle profile stored in the incident angle profile recording unit and an approximation formula stored in the position displacement approximation formula recording area, and then stored in the position displacement amount profile recording area.

Figure 28:
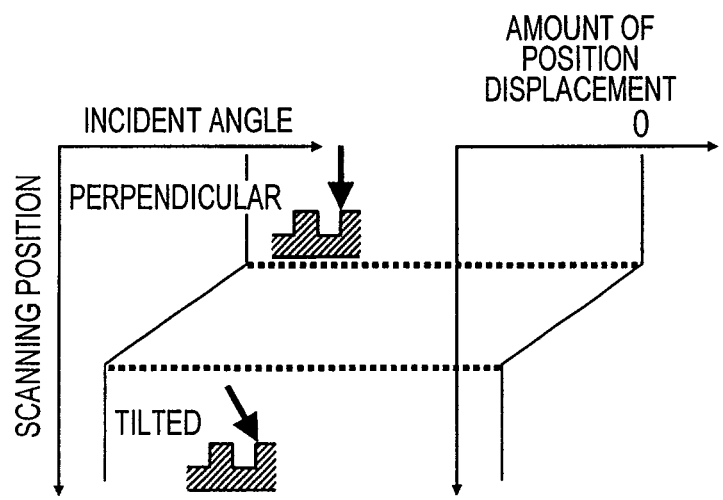
FIG. 28 is an explanatory diagram according to the eighth embodiment, which is a graph showing a relationship between the scanning position and an incident angle of the primary electron and the relationship between the scanning position and an estimated amount of position displacement of the scanning position.

Further, in the right side of FIG. 28, since the primary electron beam is perpendicularly incident to the upper part of the scanning area, the amount of estimated position displacement is correspondingly 0. However, generally, it may not be limited to 0. In step 1903 after estimating the amount of position displacement (2203 in the fifth embodiment), referring to the incident angle profile and the position displacement amount profile previously stored, by sending a control signal from the incident angle/image shift/scanning cooperative controller to the alignment deflector controller, the image shift deflector controller, and the scanning deflector controller, at the same time when the incident angle of the primary electron is changed in accordance with the incident angle profile while scanning the primary electron beam, the primary electron beam is deflected by an amount that the position displacement amount profile is inversed positive to negative or negative to positive to correct the position displacement.

As a result, even in case of observation with a high magnification, it is possible to use the incident angle profile having a large amount of change in incident angle, thereby improving the accuracy of the irregularity judgment. Further, it is possible to improve the success rate of the irregularity judgment.

According to the present embodiment, it is possible to provide an electron beam device that is capable of judging the irregularities of a periodic pattern formed on a substrate in a short time. Further, it is possible to provide an electron beam device that is capable of judging the irregularities under a certain optical condition.

Ninth Embodiment

Figure 29:
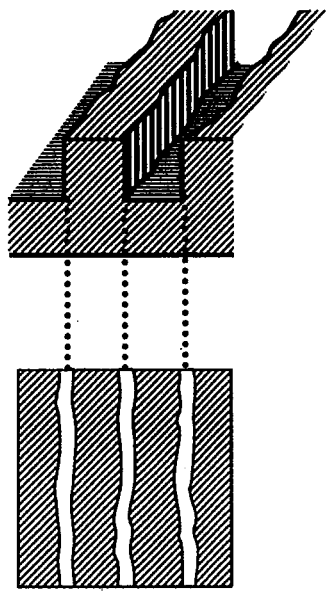
FIG. 29 is an explanatory diagram according to a ninth embodiment, which shows an example of a typical line edge roughness and an SEM image in which the line edge roughness is reflected.

A ninth embodiment will be described with reference to FIGS. 29 and 30. Further, the matters that are described in any of the fourth to eighth embodiments, but not described in the present embodiment, are the same as the fourth to eighth embodiments.

The present embodiment is a method of using roughness occurring in the sample. An actual sample has roughness of an edge in a direction direct to the period of the pattern. For example, as shown in the upper part of FIG. 29, in the actual line pattern, roughness called a line edge roughness is present in a direction where the line extends.

This roughness is random and different for every edge. Further, the line roughness is reflected as a shape of a white band in the SEM image as shown in the lower part of FIG. 29. Therefore, when the SEM image acquired with a perpendicularly incident primary electron is compared with the SEM image acquired with a tilted incident primary electron, by selecting a white band in which the roughness matches, it is possible to identify the white band corresponding to the same edge.

Figure 30:
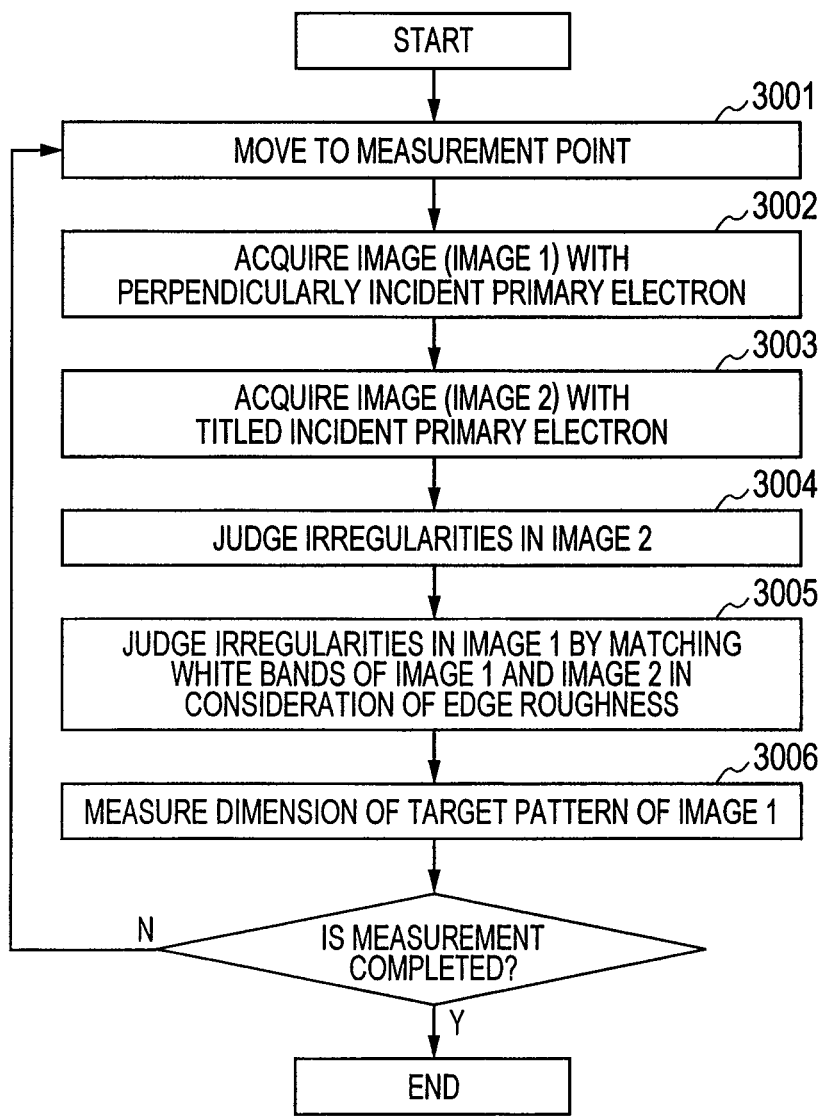
FIG. 30 is a flowchart of automatic dimension measurement of a sample pattern according to the ninth embodiment.

FIG. 30 is a flowchart when the irregularity judgment is performed using the roughness at plural points on a semiconductor wafer on which a line and space pattern is formed and a width of a line pattern or a space pattern is automatically measured. Hereinafter, each step of the flowchart will be described.

First, in step 3001, the irradiating position of the primary electron moves to a location to be measured.

Further, in step 3002, an SEM image is acquired with a perpendicularly incident primary electron, which is referred to as an image 1. Further, in step 3003, an SEM image is acquired with a tilted incident primary electron, which is referred to as an image 2.

Next, in step S3004, irregularities in the image 2 are judged. The irregularity judgment is performed using the method of comparing the adjacent white bands in the image (image 2) acquired with tilted incident primary electron among the methods described in the sixth embodiment.

After judging the irregularities in the image 2, in step S3005, white band matching is performed. In this case, a white band corresponding to an edge at a side where the primary electron is not contact with the side of the pattern when the incident primary electron is tilted, that is, one of white bands whose white band width is small (or the peak intensity is small) is selected. Further, a white band in which the selected white band most matches roughness is determined from the white bands of the image 1.

By doing so, since the white band corresponding to the same edge may be identified, it is possible to judge the irregularities in the image 1. When the white band is identified, if the correlation value is below a certain threshold value, it may be judged that the identification fails. In this case, the white band selected first from the image 2 may be considered as a different one and then identified again.

Further, in this identification method, as the white band selected first from the image 2, the edge side where the primary electron is not contact with the side of the pattern when the incident primary electron is tilted is selected by the above reason. When the primary electron is perpendicularly incident, roughness of the highest portion (top) of the pattern is reflected in the white band of the SEM image. Even when the incident angle of the primary electron is tilted in a direction where the primary electron is not contacted with the side wall of the pattern, roughness of the top of the pattern is also reflected in the white band.

In the meantime, when the incident primary electron is tilted so as to irradiate the primary electron on the side wall of the pattern, not only the top of the pattern, but also the shape of the root (bottom) are reflected in the white band. Therefore, the change in the roughness of the white band from the time when the primary electron is perpendicularly incident is large. Accordingly, in order to correctly identify the white bands corresponding to the same edge at the time of being perpendicularly incident and at the time of being incident tilted, it is required to use a white band corresponding to an edge where the primary electron is not contacted with the side of the pattern when the incident primary electron is tilted.

If the irregularities may be judged in the image 1 by the above method, it can be seen which part of the image 1 corresponds to the line of the sample pattern and which part corresponds to the space, such that, in step 3006, the dimension of the target pattern may be measured.

When the measurement at one point is completed, the sequence moves to another measurement point and the same sequence is repeated until the measurement for all set measurement points is completed, and then the measurement is completed.

By using the present embodiment, it is possible to judge the irregularities of the sample pattern without performing correction to automatically measure the dimension of the line and space pattern.

Further, even in the present embodiment, a method of correcting the position displacement described in the sixth embodiment may be combined to be used. If the amount of position displacement between the image 1 and image 2 is large or the magnification is high, since the overlapping of the capturing area of the image 1 and the image 2 becomes small or does not exist, there is a possibility that there will be no white band captured in both images. In this case, in step 3005, it is not possible to accurately identify the white band.

In this regard, if the position displacement correction in the sixth embodiment is combined to be used, the amount of position displacement between the image 1 and the image 2 may be significantly reduced, thereby avoiding the problem that the same white band does not exist. Specifically, before step 3003, steps of correcting the position displacement corresponding to steps 2403 and 2404 may be inserted and after step 3006, a step of cancelling the correction in step 2409 may be inserted.

According to the present embodiment, it is possible to provide an electron beam device that is capable of judging the irregularities of a periodic pattern formed on a substrate in a short time. Further, it is possible to provide an electron beam device that is capable of judging the irregularities under a certain optical condition.

Tenth Embodiment

A tenth embodiment will be described with reference to FIG. 31. Further, the matters that are described in any of the fourth to ninth embodiments, but not described in the present embodiment, are the same as the fourth to ninth embodiments.

The present embodiment is an embodiment that the image used for irregularity judgment is also used for correcting the focus when the fourth embodiment and the sixth embodiment among the fourth, sixth, seventh, ninth, and eighth embodiments are combined to be used. In this method, the focus is corrected using that the amount of the position displacement of the image has a linear relationship with the amount of focus deviation.

Even though not shown in the flowcharts shown in FIGS. 19, 22, 24, 26, and 30, generally, a step of correcting the focal position of the incident electron exists. The general focus correction method acquires plural SEM images while changing an objective lens current or retarding voltage, and then compares the SEM images to obtain the in-focus condition, which takes so long time.

In the present embodiment, since the focus is corrected in a short time, the same dimension measurement as the fourth, sixth, seventh, eighth, and ninth embodiments may be measured in a short time. Further, the irregularity judgment method in the fourth, sixth, seventh, eighth, and ninth embodiments may be applied if the SEM image has a noticeable white band even though the SEM image is blurred due to the focus deviation.

Therefore, the precise focus correction may be performed after the irregularity judgment, and the image for judging the irregularities may be used for focus correction. Hereinafter, the focus correction method of the present embodiment will be described in detail.

Figure 31:
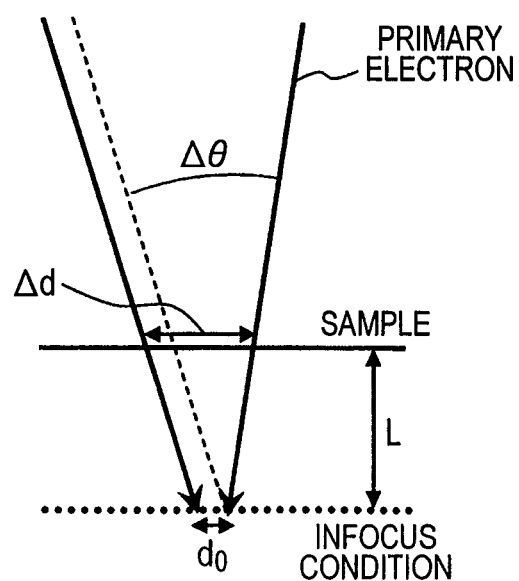
FIG. 31 is a diagram of relationship between focus deviation and position displacement according to a tenth embodiment.

FIG. 31 is a cross-sectional view illustrating a status where the primary electron is incident onto the sample when there is focus deviation. If the deviation from the in-focus condition (dotted line) of the sample position (solid line) is denoted by reference character L, the amount d of irradiating position displacement of the primary electron occurring when the incident angle of the primary electron is changed by $\Delta\theta$ with respect to the amount $d_o$ of the position displacement under the in-focus condition is as follows.

$$d = d_0 + L \cdot \Delta\theta \quad \text{[Equation 8]}$$

Therefore, if the measurement is performed under the in-focus condition in advance to obtain $d_o$ to store in the recording unit, the amount d of the position displacement in the image for performing the irregularity judgment is evaluated to obtain the amount L of focus deviation. Or in an electronic optical system in which $d_o/\Delta\theta$ is smaller than the focus adjustment accuracy to be obtained, the d0 is neglected, and $L = d/\Delta\theta$ and the amount L of the focus deviation may be obtained only from the amount d of the position displacement. Further, by using the method described in the sixth embodiment, if the $d_o$ becomes sufficiently small, it is possible to obtain L only from d in a certain potential optical system.

By the above method, it is possible to obtain the amount L of the focus deviation using the SEM image for judging the irregularities. Further, by using the relationship between the amount of focus deviation obtained in advance and the amount of change in excitation of the objective lens, the amount of change in excitation of the objective lens required to correct the amount L of the focus deviation is obtained, and then the focus may be adjusted by the objective lens controller. Or, instead of controlling the excitation of the objective lens, the retarding voltage may be controlled to adjust the focus.

In the present embodiment, after adjusting the focus by the above-described method, a SEM image for measuring the dimension of the target pattern is acquired. Specifically, in a method that combines the fourth embodiment and the sixth embodiment among the fourth embodiment and the eighth embodiment, after step 1904, the focus correcting is performed, so that addition image does not need to be acquired.

Therefore, it is possible to significantly shorten the time spent for focus adjustment in the related art.

Further, in the sixth, seventh, and ninth embodiments, after steps S2409, S2608, and S3006, acquisition of an image for focus correction and dimension measurement is required. However, as compared with the case of using the focus adjustment method of the related art, totally high speed dimension measurement may be expected. Further, in the fifth embodiment, if the focus correction according to the present embodiment is performed, instead of step 2205, it is required to acquire an image for the focus correction and the dimension measurement, which is substantially the same as the fourth embodiment but is not applied to the present embodiment.

If it is required to measure the dimension with high accuracy, before acquiring the SEM image, the focus needs to be adjusted. Further, if the sample is charged and the focus is deviated, the focus adjustment is essential. In the present embodiment, since an image for irregularity judgment may be used to adjust the focus, it is not required to acquire a new image only for focus adjustment, thereby improving the throughput.

Even in the present embodiment, it is possible to provide an electron beam device that is capable of judging the irregularities of a periodic pattern formed on a substrate in a short time. Further, it is possible to provide an electron beam device that is capable of judging the irregularities under a certain optical condition. Furthermore, it is possible to provide an electron beam device having high throughput.

INDUSTRIAL APPLICABILITY

The present invention is applicable as a minute pattern evaluation technology that scans a charged particle beam on a surface of a sample to detect a secondary charged particle or a reflective particle generated from the sample, thereby acquiring a two dimensional scanning image that indicates a shape or a dimension of a minute pattern formed on the surface of the sample. Further, the present invention is applicable as a device that observes a shape of a sample using an electron beam, specifically, an electron beam device that may simply judge irregularities on a surface of the sample.

REFERENCE SIGNS LIST

2 . . . Retarding power source
3 . . . Focus controller
4 . . . Astigmatism corrector controller
5 . . . Processing unit
6 . . . Recording unit
7 . . . Electron gun controller
8 . . . Control system for entire device
9a . . . Second deflector
9b . . . First deflector
9c . . . Second deflection controller
9d . . . First deflection controller
10 . . . Objective lens
11 . . . Wafer
12a . . . Casing
12b . . . Vacuum sample chamber
12c . . . Load rock chamber
13 . . . Wafer holder
14 . . . Electron gun
15 . . . Primary electron beam
16 . . . Convergence lens
17 . . . Secondary electron
18 . . . Detector
19 . . . Astigmatism corrector 70 ... Display unit
20 ... Sample surface
21 ... Beam before being tilted that irradiates point A
22 ... Beam after beam 21 is tilted
21a ... Image acquired by beam 21
22a ... Image acquired by beam 22
23 ... Beam before being tilted that irradiates point B
24 ... Beam after beam 23 is tilted
23a ... Image acquired by beam 23
24a ... Image acquired by beam 24
25 ... An angle of tilting beam
29 ... Sample surface
31 ... Image in which beam tilted at 0 degree direction is projected in XY plane
32 ... Image in which beam tilted at 90 degree direction is projected in XY plane
33 ... Image in which beam tilted at 225 degree direction is projected in XY plane
34 ... In which beam tilted at 315 degree direction is projected in XY plane
50 ... Sample surface
51 ... Beam before being tilted that irradiates point A
52 ... Beam after beam 51 is tilted
53 ... Image acquired by beam 51
54 ... Image acquired by beam 52
55 ... Beam before being tilted that irradiates point B
56 ... Beam after beam 55 is tilted
57 ... Image acquired by beam 55
58 ... Image acquired by beam 56
59 ... Sample surface
91 ... Image in which beam tilted at 0 degree direction is projected in XY plane
1501 ... Primary electron beam
1502 ... Section of sample having line and space pattern formed on surface
1503 ... SEM image
1504 ... Incident angle of primary electron with respect to sample
1505 ... White band
1601 ... Example of SEM image acquired with primary electron incident perpendicularly with respect to line and space sample
1602 ... Example of SEM image acquired with incident primary electron tilted with respect to line and space sample
1603 ... Period of line and space pattern
1701 ... Electron gun
1702 ... Primary electron
1703 ... Alignment deflector
1704 ... Secondary electron
1705 ... Secondary electron detector
1706 ... Image shift deflector
1707 ... Scanning deflector
1708 ... Objective lens
1709 ... Sample
1710 ... Stage
1711 ... Electron gun controller
1712 ... Alignment deflector controller
1713 ... Image shift deflector controller
1714 ... Scanning deflector controller
1715 ... Objective lens controller
1716 ... Retarding voltage controller
1717 ... Recording unit
1718 ... Control operating unit of entire device
1719 ... Display unit
1720 ... Column
1721 ... Incident profile recording area
1722 ... Incident angle/scanning cooperative controller
1723 ... Irregularity judgment operating unit
1801 ... Primary electron irradiating area
1803 to 1805 ... Order that scans primary electron
1806 ... SEM image
1807 to 1809 ... Order that SEM images are formed
2001 ... Example of dimension measurement area in fifth embodiment
2301 ... Position displacement approximation formula recording area
2302 ... Position displacement estimation operating unit
2303 ... Position displacement correction controller
2501 ... Position displacement correction matching operating unit
2701 ... Position displacement amount profile recording area
2702 ... Positional displacement amount profile estimation operating unit
2703 ... Incident angle/image shift/scanning cooperative controller

The invention claimed is:

1. A minute pattern evaluation method that uses a charged particle beam of a charged particle beam device including a charged particle optical system and a processing unit, the method comprising the steps of:
irradiating the sample with the charged particle beam in a direction in accordance with an optical system condition for irradiating a charged particle beam and acquiring an image;
irradiating the sample with the charged particle beam in another direction in accordance with the optical system condition for irradiating a charged particle beam and acquiring another image;
comparing the image and the another image to measure a pattern position displacement amount between the images, and
correcting, by the processing unit, the pattern position displacement amount based on a correction amount, wherein the correction amount is calculated based on the beam deflection of the charged particle beam that moves an image acquisition position on the sample.

2. The pattern evaluation method according to claim 1, wherein the processing unit calculates an astigmatic difference or an amount of focus position displacement from the pattern position displacement amount corrected with the correction amount, or both of them.

3. The pattern evaluation method according to claim 2, wherein the processing unit calculates the correction amount in accordance with an accelerating voltage of the charged particle beam or a height of the sample.

4. The pattern evaluation method according to claim 2, wherein the processing unit calculates the correction amount in accordance with a tilting direction and a tilting angle of the charged particle beam to be irradiated.

5. The pattern evaluation method according to claim 1, wherein the charged particle beam is irradiated by feeding back the correction amount of the pattern position displacement amount to the optical system.

6. The pattern evaluation method according to claim 5, wherein the processing unit calculates the correction amount of the pattern position displacement amount in accordance with an accelerating voltage of the charged particle beam or the height of the sample.

7. The pattern evaluation according to claim 5, wherein the processing unit calculates the correction amount of the pattern position displacement amount in accordance with a tilting direction and a tilting angle of the charged particle beam to be irradiated.

8. The pattern evaluation method according to claim 1, wherein the correction amount is obtained by a polynomial equation depending on the amount of beam deflection of the charged particle beam.

9. The pattern evaluation method according to claim 1, wherein the processing unit compares the images obtained by irradiating the charged particle beam on the sample from four different directions to measure the pattern position displacement amount between the images and calculates the astigmatic difference from the pattern position displacement amount corrected by the correction amount.

10. The pattern evaluation method according to claim 1, wherein information regarding the optical system condition that calculates the correction amount is displayed on a display unit of the charged particle beam device.

11. A pattern evaluation device using a charged particle beam, comprising:
a charged particle optical system that irradiates a charged particle beam on a sample;
a memory unit that registers and stores an optical system condition of the charged particle optical system for irradiating the charged particle beam from at least two different directions;
a processing unit that calculates a pattern position displacement amount between images by comparing images obtained by irradiating the charged particle beam from the at least two directions based on the optical system condition; and
a beam deflector that deflects the charged particle beam,
wherein the processing unit calculates an amount of correction of the pattern position displacement amount based on the beam deflection of the beam deflector that moves an image acquisition position on the sample and wherein the pattern position displacement amount is corrected using the calculated amount of correction.

12. The pattern evaluation device according to claim 11, wherein the processing unit calculates an amount of astigmatic difference of the charged particle beam or an amount of focus position displacement from the pattern position displacement amount corrected with the amount of correction, or both of them.

13. The pattern evaluation device according to claim 12, wherein the processing unit calculates the amount of correction in accordance with an accelerating voltage of the charged particle beam or a height of the sample.

14. The pattern evaluation device according to claim 12, wherein the processing unit calculates the amount of correction in accordance with a tilting direction and a tilting angle of the charged particle beam to be irradiated.

15. The pattern evaluation device according to claim 11, further comprising:
a controller that controls the charged particle beam to be irradiated by feeding back the amount of correction of the pattern position displacement amount to the optical system.

16. The pattern evaluation device according to claim 15, wherein the processing unit calculates the amount of correction of the pattern position displacement amount in accordance with an accelerating voltage of the charged particle beam or the height of the sample.

17. The pattern evaluation device according to claim 15, wherein the processing unit calculates the amount of correction of the pattern position displacement amount in accordance with a tilting direction and a tilting angle of the charged particle beam to be irradiated.

18. The pattern evaluation device according to claim 12, wherein the processing units calculates the amount of correction by a polynomial equation depending on the amount of beam deflection of the beam deflector.

19. The pattern evaluation device according to claim 12, wherein the memory unit registers and stores the optical system condition of the charged particle optical system for irradiating from at least four different directions.

20. A pattern evaluation device by a charged particle beam device, comprising:
a stage that loads a sample;
a charged particle optical system that irradiates a charged particle beam on a sample on the stage to detect a secondary charged particle generated from the sample;
a controller that controls the charged particle optical system by determining an optical system condition of the charged particle optical system and controls so as to acquire an image of the sample from the detected secondary charged particle;
a beam deflector that deflects the charged particle beam in order to move the image acquisition position of the sample; and
a display unit that displays the image,
wherein the controller includes:
a memory unit that stores the optical system condition for irradiating the charged particle beam on the sample from at least two different directions; and
a processing unit that calculates a pattern position displacement amount between images by comparing images of the sample obtained by irradiating the charged particle beam from the at least two directions based on the optical system condition, calculates an amount of correction of the pattern position displacement amount based on the beam deflection of the beam deflector, corrects the pattern position displacement amount using the calculated amount of correction, and calculates an amount of astigmatic difference of the charged particle beam or an amount of focus position displacement from the amount of corrected pattern position displacement, or both of them.

21. An electron beam device, comprising:
an electron source;
a stage that loads a sample;
a detector that detects an electrical signal from the sample;
an incident angle/scanning cooperative controller that controls the scanning and the incident angle to the sample of the electron beam discharged from the electron source; and
a control operating unit configured to control the electron source, the stage, and the detector, and to create image data by using the electrical signal detected by the detector while changing the incident angle to the sample with the incident angle/scanning cooperative controller,
wherein the control operating unit includes:
an irregularity judgment operating unit that judges irregularities on a surface of the sample using the image data created based on the electrical signal from the sample generated by the scanned electron beam.

22. The electron beam device according to claim 21, wherein the control operating unit has a function of automatically measuring a dimension of a designated pattern of the sample after judging the irregularities by the irregularity judgment operating unit.

* * * * *